(12) United States Patent
Choi et al.

(10) Patent No.: US 10,120,031 B2
(45) Date of Patent: Nov. 6, 2018

(54) PROBE FOR TESTING CHARGING/DISCHARGING OF SECONDARY BATTERY

(71) Applicant: MEGATOUCH CO., LTD., Cheonan-si (KR)

(72) Inventors: Woo Yong Choi, Cheonan-si (KR); Byung Il Lee, Cheonan-si (KR); Hyeon Sik Kim, Cheonan-si (KR)

(73) Assignee: MEGATOUCH CO., LTD., Cheonan-si (KR)

( * ) Notice: Subject to any disclaimer, the term of this patent is extended or adjusted under 35 U.S.C. 154(b) by 0 days.

(21) Appl. No.: 15/597,600

(22) Filed: May 17, 2017

(65) Prior Publication Data

US 2017/0248659 A1    Aug. 31, 2017

Related U.S. Application Data

(63) Continuation of application No. PCT/KR2015/013899, filed on Dec. 18, 2015.

(30) Foreign Application Priority Data

Jan. 14, 2015 (KR) .................. 10-2015-0006599
Sep. 11, 2015 (KR) .................. 10-2015-0128950

(51) Int. Cl.
G01R 31/36 (2006.01)
H01M 10/48 (2006.01)
H01M 10/42 (2006.01)
G01R 1/067 (2006.01)

(52) U.S. Cl.
CPC .... *G01R 31/3644* (2013.01); *H01M 10/4285* (2013.01); *H01M 10/48* (2013.01); *G01R 1/06722* (2013.01)

(58) Field of Classification Search
CPC .............. H01M 10/48; H01M 10/4285; H02J 50/1285; G01R 31/3644
USPC ...... 324/200, 207.11–207.19, 219, 220, 233, 324/234, 239, 241, 500, 515, 529, 530, 324/437, 750.06
See application file for complete search history.

(56) References Cited

U.S. PATENT DOCUMENTS 9,128,120 B2 * 9/2015 Lee ................. G01R 1/067

FOREIGN PATENT DOCUMENTS

| JP | 2014146504 | 8/2014 |
|---|---|---|
| KR | 20030007279 | 1/2003 |
| KR | 20040022004 | 3/2004 |
| KR | 20040072069 | 8/2004 |
| KR | 20050112397 | 11/2005 |
| KR | 20110045890 | 5/2011 |
| KR | 20140067227 | 6/2014 |

(Continued)

OTHER PUBLICATIONS

International Search Report—PCT/KR2015/013899 dated Mar. 30, 2016.

*Primary Examiner* — Melissa Koval
*Assistant Examiner* — Trung Nguyen
(74) *Attorney, Agent, or Firm* — Cantor Colburn LLP

(57) ABSTRACT

A charge and discharge test probe for a secondary battery includes: an inner plunger moved up and down by elastic force of a spring; a head having a central through hole through which the inner plunger passes to protrude from an upper end of the head; and a first conductive elastic member mounted to the head.

19 Claims, 34 Drawing Sheets

(56) References Cited

FOREIGN PATENT DOCUMENTS

KR      20150026558      3/2015
KR      20150026558 A  *  3/2015

* cited by examiner (Prior Art)

(CROSS-SECTIONAL VIEW TAKEN ALONG LINE A-A)

(CROSS-SECTIONAL VIEW TAKEN ALONG LINE A-A)

(CROSS-SECTIONAL VIEW TAKEN ALONG LINE A-A)

PROBE FOR TESTING CHARGING/DISCHARGING OF SECONDARY BATTERY

CROSS-REFERENCE TO RELATED APPLICATION

This application is a continuation of PCT Patent Application No. PCT/KR2015/013899 filed on Dec. 18, 2015, which claims priority to and the benefit of Korean Patent Application No. 10-2015-0006599 filed on Jan. 14, 2015, and Korean Patent Application No. 10-2015-0128950 filed on Sep. 11, 2015, and the entire disclosures of which are incorporated herein by reference.

BACKGROUND OF THE INVENTION

1. Field of the Invention

The present invention relates to a charge and discharge test probe for a secondary battery, the probe enabling stable testing by having an increased contact area with respect to an electrode terminal of a secondary battery.

2. Description of the Prior Art

Secondary battery is a generic term for batteries that can be repeatedly recharged unlike primary batteries that cannot be recharged. Secondary batteries are widely used in electronic devices such as mobile phones, laptop computers, MD players, general computers, and camcorders because they enable electronic devices to be smaller and lighter, exhibit high operation stability even while undergoing repeated charging and discharging, and can be freely recharged without a memory effect.

A lithium secondary battery, which is a secondary battery, includes a case and an electrode assembly rolled in the case, in which the electrode assembly includes a positive plate and a negative plate that are alternately arranged with a separator interposed therebetween. In addition, a liquid electrolyte is contained in the case so as to soak into the electrode assembly. Secondary batteries can be provided in various shapes, for example, a prismatic shape, a cylindrical shape, or a pouch shape.

One of the major factors indicating the performance of a secondary battery is current capacity during discharge. Current capacity of secondary batteries having same specifications needs to rarely vary or vary within a small and predetermined distribution range. For this reason, all of the produced secondary batteries undergo test of electrical characteristics including, for example, a charge and discharge test, and defective products determined through the test are removed.

FIG. 1 of Korean Patent Application Publication No. 10-2011-0045890 (titled "Secondary Cell Charge-Discharge Test Probe for Applying Voltage and Current") discloses a conventional probe.

The conventional test probe shown in FIG. 1 is a voltage and current application-type charge and discharge test probe for a secondary battery. The conventional test probe includes: a cylindrical outer body that can be elastically moved up and down; an outer plunger combined with an end of the outer body; an inner body installed in the outer body and elastically moved up and down; an inner plunger combined with an end of the inner body, spaced from the outer plunger, and elastically moved up and down; and an insulator electrically insulating the inner plunger, the inner body, and the outer body from each other, wherein the outer plunger is detachably combined with the end of the outer body, either an upper end of the inner body or a lower end of the inner plunger is provided with one or more elastic recesses, either the upper end of the inner body or the lower end of the inner plunger is provided with a concave portion, and the inner plunger is detachably combined with the end of the inner body by press-fitting the one or more elastic recesses into the concave portion.

The conventional test probe includes heads 101 and 901 respectively provided with contact portions 101 and 902 on the upper surfaces thereof. The contact portions 102 and 902 have a predetermined size and respectively include a voltage terminal 102 and a current terminal 902 on planar surfaces. In the process of producing lithium ion batteries that are secondary batteries, or other kinds of batteries, the current terminal 902 encounters a problem associated with current capacity. In addition, during a battery charge and discharge test, the contact portions 102 and 902 obliquely come into contact with an electrode terminal of a secondary battery. Therefore, a contact with the electrode terminal becomes unstable, resulting in contact failure, which makes it difficult to stably apply a voltage or a current to the electrode terminal.

SUMMARY OF THE INVENTION

Accordingly, the present invention has been made keeping in mind the above problems occurring in the related art, and an object of the present invention is to provide a charge and discharge test probe for a secondary battery, the probe including a head provided with an elastic contact member to come into contact with an electrode terminal of a secondary battery, whereby the probe can horizontally come into surface contact with the electrode terminal of the secondary battery, thereby having an increased contact area with respect to the electrode terminal, which enables smooth and continuous current application to the electrode terminal of the secondary battery.

In order to accomplish the above object, according to a first aspect, there is provided a charge and discharge test probe for a secondary battery, the probe including: an outer plunger having a hollow cylinder shape; an inner plunger that is coaxially arranged in the outer plunger, electrically insulated from the outer plunger, and moved up and down through the outer plunger by elastic force of a spring; a head fixed to an upper end of the outer plunger and provided with a central through hole through which the inner plunger passes to protrude outward and with a probe tip formed on an upper surface thereof; a ring-shaped recess formed around the central through hole of the head; and a ring-shaped elastic member fitted in the ring-shaped recess. In addition, preferably, the recess may be open at one end thereof and have a trapezoidal cross section such that the open end of the recess is relatively narrow and a closed end is relatively broad. In addition, the ring-shaped elastic member is installed in the recess and protrudes farther than the probe tip of the head by a predetermined height. Specifically, the ring-shaped elastic member may be preferably a canted coil spring. The canted coil spring is characterized in that it is elastically deformed by compressive force when coming into contact with an electrode terminal of a secondary battery and is recovered when the compressive force is removed.

According to a second aspect, there is provided a charge and discharge test probe for a secondary battery, the probe including: an outer plunger having a hollow cylinder shape; an inner plunger coaxially arranged in the outer plunger, electrically insulated from the outer plunger, and moved up and down through the outer plunger by elastic force of a spring; a head fixed to an upper end of the outer plunger, and provided with a central through hole through which the inner plunger passes to protrude outward and with a probe tip formed on an upper surface thereof; one or more installation recesses formed in an upper end portion of the head and arranged around the central through hole to extend in outer radial directions of the central through hole; and one or more leaf springs provided with a probe tip and respectively installed in the one or more installation recesses. A pin accommodation recess is formed in a portion of the installation recess such that a pin to fix the leaf spring is inserted in the pin accommodation recess. The installation recesses may be preferably formed on an upper side, a lower side, a left side, and a right side of the central through hole, respectively. In addition, the leaf spring may include a fixed plate that is horizontally in surface contact with the bottom of the installation recess; a pin hole formed in a portion of the fixed plate; and a probing plate extending obliquely upward from an end of the fixed plate and provided with a probe tip at an upper end thereof. In addition, the leaf spring may be fixed in the installation recess such that the probing plate is disposed to be near the central through hole. In addition, the leaf spring is elastically deformed by compressive force when coming into contact with an electrode terminal of a secondary battery and is recovered when the compressive force is removed.

According to a third, a fourth, and a fifth aspect, there are provided charge and discharge test probes for a secondary battery, each of the probes including: an outer plunger having a hollow cylinder shape; an inner plunger coaxially arranged in the outer plunger, electrically insulated from the outer plunger, and moved up and down through the outer plunger by elastic force of a spring; a head fixed to an upper end of the outer plunger and provided with a probe tip formed on an upper surface thereof; an accommodation recess having a predetermined depth and formed at a center portion of the head; and a conductive helical elastic member installed in the accommodation recess. In addition, the helical elastic member is elastically deformed by compressive force when coming into contact with an electrode terminal of a secondary battery and is recovered when the compressive force is removed, and the helical elastic member protrudes farther than the probe tip of the head. In addition, the accommodation recess includes an upper portion and a lower portion that serves as a fixing space and has a diameter larger than that of the upper portion, and the bottom of the fixing space is provided with a communication hole through which the inner plunger passes to protrude outward.

According to the third aspect, the helical elastic member may be a circular coil spring.

In addition, according to the fourth aspect, the helical elastic member may include: a helical body in which each turn of wire has a predetermined thickness, is inclined at a predetermined angle, and is arranged at regular pitches; a cylindrical hollow formed in the body; a probe tip formed on an upper portion of the body; and a fixed portion provided at an upper end of the body and having a diameter larger than that of the body. In addition, the fixed portion may be preferably fitted in the fixing space of the accommodation recess.

In addition, according to the fifth aspect, the helical elastic member may include: a helical body in which each turn of wire has a predetermined thickness, is inclined at a predetermined angle, and is arranged at regular pitches; and a probe tip assembly provided on an upper portion of the body and provided with a plurality of probe tips. The probe tip assembly has a diameter larger than that of the body. According to the fifth aspect, the accommodation recess includes a body accommodation portion to accommodate the body and a probe tip assembly accommodation portion to accommodate the probe tip assembly, in which the body accommodation portion has a diameter smaller than that of the probe tip assembly accommodation portion.

Specifically, according to a sixth aspect, there is provided a charge and discharge test probe for a secondary battery, the probe including: an outer plunger having a hollow cylinder shape; an inner plunger coaxially arranged in the outer plunger, electrically insulated from the outer plunger, and moved up and down through the outer plunger by elastic force of a spring; a head fixed to an upper end of the outer plunger and provided with a probe tip formed on an upper surface thereof; an accommodation recess having a predetermined depth and formed in a center portion of the head; and a plurality of conductive helical elastic members fitted in the accommodation recess. Each of the helical elastic members includes: a helical body in which each turn of wire has a predetermined thickness, is inclined at a predetermined angle, and is arranged at regular pitches; a cylindrical hollow formed in the body; a probe tip formed on an upper surface of the body; and a fixed portion provided at a lower end of the body and having a diameter larger than that of the body. The accommodation recess includes an upper portion and a lower portion serving as a fixing space and having a diameter larger than that of the upper portion, and the bottom of the fixing space is provided with a communication hole through which the inner plunger passes to protrude outward. The fixed portion may be preferably fitted in the fixing space of the accommodation recess. Each of the helical elastic members protrudes farther than the probe tip by a predetermined height. Preferably, each of the helical elastic members may be elastically deformed by compressive force when coming into contact with an electrode terminal of a secondary battery and be recovered when the compressive force is removed. Preferably, the helical elastic members may be arranged such that one of the helical elastic members is fitted in another one.

In summary, each of the charge and discharge test probes according to the first to sixth aspects includes: an outer plunger having a hollow cylinder shape with open ends; an inner plunger coaxially arranged in the outer plunger, electrically insulated from the outer plunger, and moved up and down through the outer plunger by elastic force of a spring; a head fixed to an upper end of the outer plunger and provided with a central through hole through which the inner plunger passes to protrude outward and with a probe tip formed on an upper surface thereof; and a conductive elastic member mounted to the head. In addition, the elastic member may be elastically deformed by compressive force when coming into contact with an electrode terminal of a secondary battery and be recovered when the compressive force is removed. The elastic member may protrude farther than the probe tip by a predetermined height.

As described above, according to the charge and discharge test probe for a secondary battery of the present invention, the head of the probe is provided with the elastic contact member to come into contact with the electrode terminal of a secondary battery. Therefore, the head comes into surface contact with the electrode terminal of the secondary battery. That is, a contact area between the head of the probe and the electrode terminal of the secondary battery is increased, which enables continuous and smooth application of electric current to the electrode terminal.

DETAILED DESCRIPTION OF THE EXEMPLARY EMBODIMENTS

Figure 1:
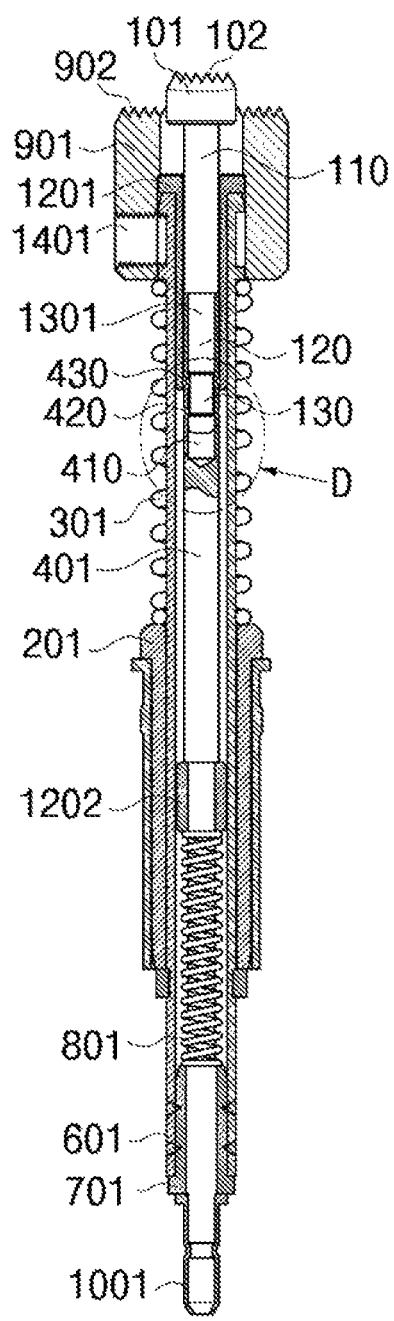
FIG. 1 is a cross-sectional view of a voltage and current application-type charge and discharge test probe for a secondary battery, according to a conventional art.

Hereinafter, charge and discharge test probes for a secondary battery, according to preferred embodiments of the invention, will be described in detail with reference to the accompanying drawings.

The embodiments described below are provided only for illustrative purposes and should not be construed as limiting the scope of the invention. All modifications, changes, alterations, and equivalents which can be easily derived from the detailed description and embodiments of the invention by those skilled in the art are construed to fall within the scope of the invention.

The gist of a test probe for a secondary battery disclosed by the invention is a structure in which a head 130 is provided with an additional contact member 220, 320, 420, 520, 620, or 720a and 720b to come into contact with an electrode terminal 10 of a secondary battery. The additional contact member enables the head to come into surface contact with the electrode terminal 10, thereby increasing a contact area of the test probe with respect to the electrode terminal 10, which results in reliable electric current transmission to the electrode terminal.

Before describing charge and discharge test probes 1000, 2000, 3000, 4000, 5000, and 6000 for a secondary battery, according to preferred embodiments of the invention, the construction of a general charge and discharge test probe for a secondary battery will be briefly described.

The basic construction of a general charge and discharge test probe for a secondary battery includes an outer plunger having a hollow cylinder shape and an inner plunger installed in the outer plunger, protruding outward from an upper end and a lower end of the outer plunger, electrically insulated from the outer plunger, and elastically moved up and down through the outer plunger by elastic force of a spring.

A stopper is installed in a lower end portion of the inner plunger, and a test is performed in a state in which a lower end of the stopper is electrically connected to a test apparatus.

The charge and discharge test probes 1000, 2000, 3000, 4000, 5000, and 6000 according to the preferred embodiments of the invention have a similar construction to the convention charge and discharge test probe described above. Therefore, a description of the basic construction of the test probes according the preferred embodiments of the invention will be omitted, but a description of the invention will be made focusing on the contact members 220, 320, 420, 520, 620, 720a, and 720b, each being provided to an upper end portion of the head 130 provided to an upper portion of the outer plunger to increase a surface contact area with respect to an electrode terminal 10.

The charge and discharge test probes 1000, 2000, 3000, 4000, 5000, and 6000 for a secondary battery, according to the embodiments of the invention, include common elements. Therefore, hereinafter, like reference characters will refer to like elements in the following description.

FIGS. 2 to 7 are views illustrating a charge and discharge test probe 1000 for a secondary battery, according to a first embodiment of the invention. The charge and discharge test probe 1000 for a secondary battery will be described with reference to FIGS. 2 to 7.

Figure 2:
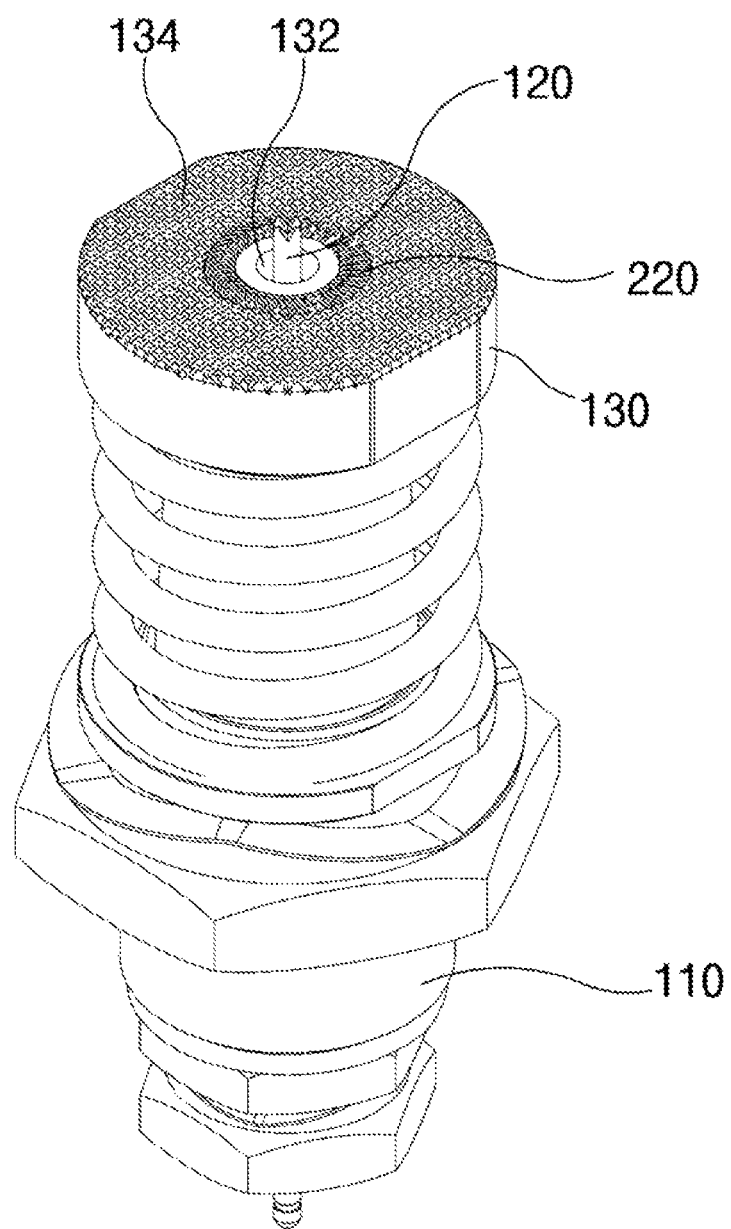
FIG. 2 is a perspective view of a probe according to a first embodiment.
Figure 3:
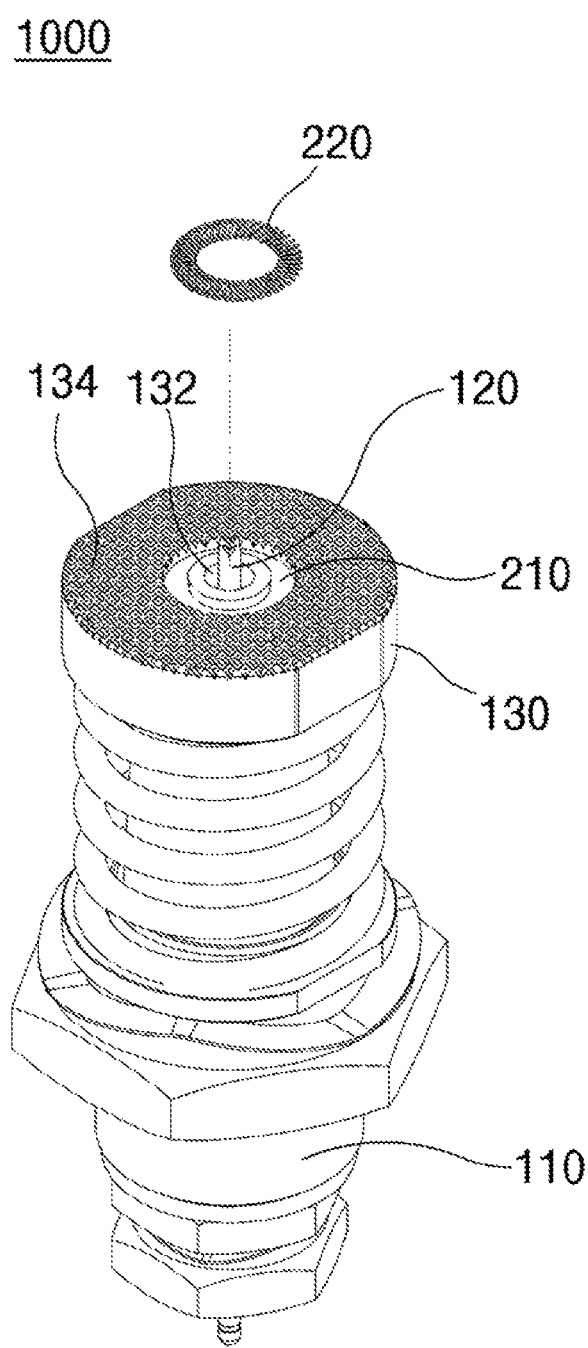
FIG. 3 is a partially exploded perspective view of the probe according to the first embodiment, in which a canted coil spring is separated from the probe.
Figure 4:
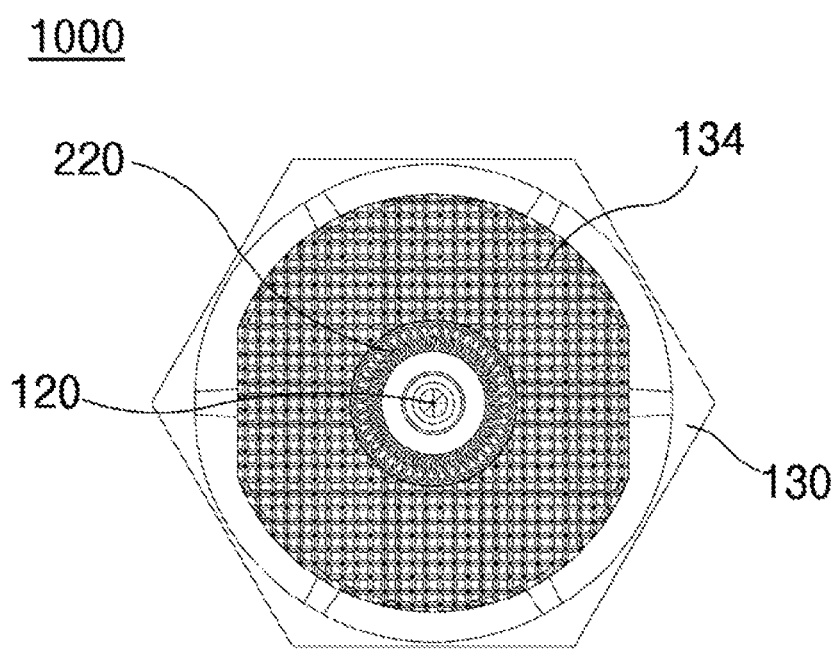
FIG. 4 is a plan view of a head of the probe according to the first embodiment.

Referring to FIGS. 2 to 4, the charge and discharge test probe 1000 for a secondary battery, according to the first embodiment of the invention, includes a head 130 fixed to an upper end of an outer plunger and provided with a plurality of probe tips 134 having contact points to come into contact with an electrode terminal 10 of a secondary battery during test of the secondary battery.

The head 130 is provided with a central through hole 132 through which an inner plunger 120 passes to protrude from an upper end of the head 130. A ring-shaped recess 210 is formed around the central through hole 132 at an upper end portion of the head 130.

A ring-shaped elastic member 220, for example, a canted coil spring may be stably installed in the recess 210. Alternatively, the recess 210 may have a rectangular shape. An upper end of the recess 210 is open so that the canted coil spring 220 can be inserted into the recess 210 through the opening. Preferably, the recess 210 has a trapezoidal cross section that is relatively narrower at an upper end and relatively broader at a lower end. The trapezoidal recess 210 enables the canted coil spring 220 to be more securely fixed in the recess 210.

Figure 5:
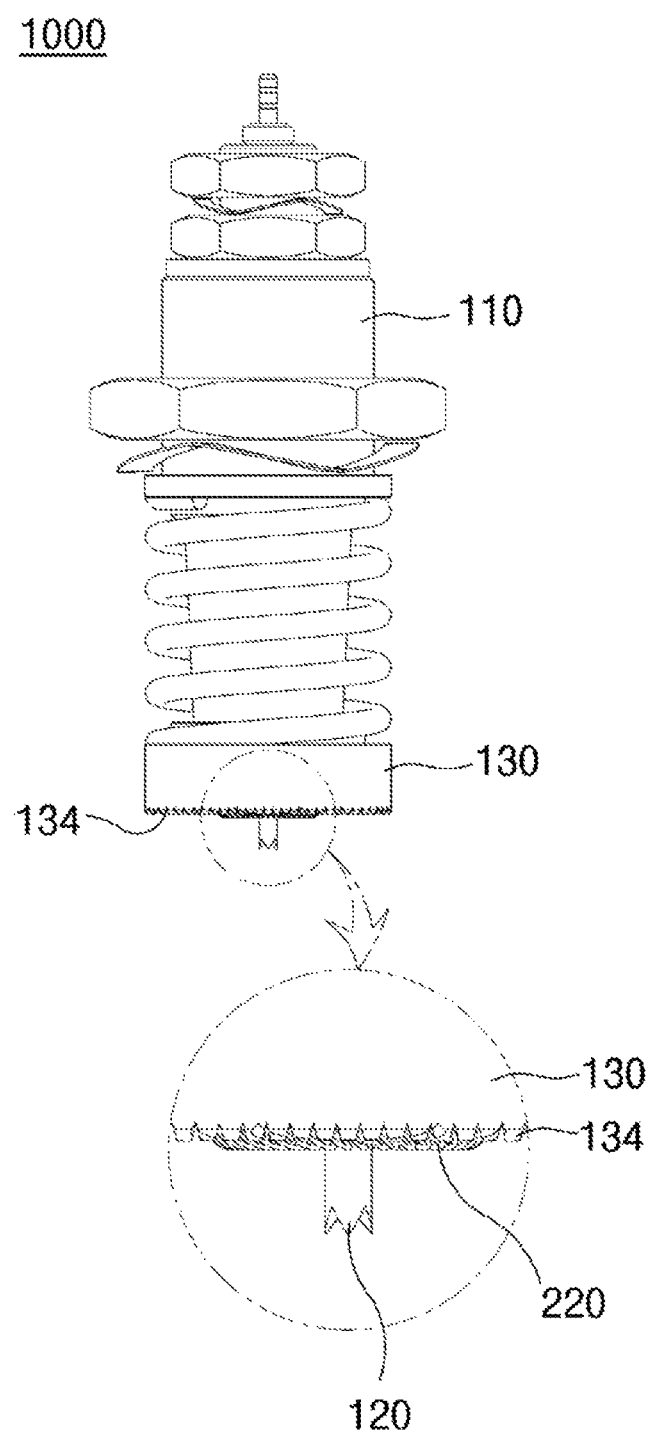
FIG. 5 is a partially expanded view of the head of the probe according to the first embodiment.

Referring to FIG. 5, the canted coil spring 220 is installed in the recess 210, and protrudes farther from the upper end of the head 130 than the probe tips 134. The canted coil spring 220 may be preferably a conductive spring.

The canted coil spring 220 has a contact point that comes into contact with the electrode terminal 10, which increases a contact area of the test probe with respect to the electrode terminal 10. Therefore, a large amount of current per time unit can be applied to the electrode terminal 10. In addition, the canted coil spring 220 can compensate for an error that is likely to occur when the probe tips 134 of the head 130 come into contact with the electrode terminal 10.

The operation of the charge and discharge test probe 1000 according to the first embodiment of the invention will be described with reference to FIGS. 6 and 7. The inner plunger 120 that vertically protrudes from the upper end of the head 130 first comes into contact with the electrode terminal 10, the canted coil spring 220 is then compressed against the periphery surface of the inner plunger 120 and comes into contact with the electrode terminal 10, and finally the probe tips 134 of the head 130 come into contact with the electrode terminal 10.

Here, the canted coil spring 220 is canted or inclined at an equal inclination angle in all directions. Here, the term "canted" refers to the shape of the coil that is always inclined at an equal inclination angle in all directions. Since the coil is inclined, the coil can be easily compressed in a lateral direction. Therefore, the canted coil spring 220 provided on the head 130 comes into contact with the electrode terminal 10, thereby improving electrical characteristics.

The canted coil spring 220 is elastically deformed by compressive force when coming into contact with the electrode terminal 10 and is recovered when the canted coil spring 220 moves off the electrode terminal 10 because the compressive force is removed.

As described above, at the time of testing a secondary battery, the head 130 comes into contact with the electrode terminal such that the inner plunger 120 first comes into contact with the electrode terminal 10, the canted coil spring 220 then comes into contact with the electrode terminal 10, and the probe tips 134 finally come into contact with the electrode terminal 10, whereby sensing is performed.

FIGS. 8 to 12 are views illustrating the charge and discharge test probe 2000 for a secondary battery, according to the second embodiment of the invention. The charge and discharge test probe 2000 according to the second embodiment of the invention will be described with reference to FIGS. 8 to 12.

The charge and discharge test probe 2000 according to the second embodiment of the invention has all of the features of the charge and discharge test probe 1000 according to the first embodiment of the invention.

Figure 8:
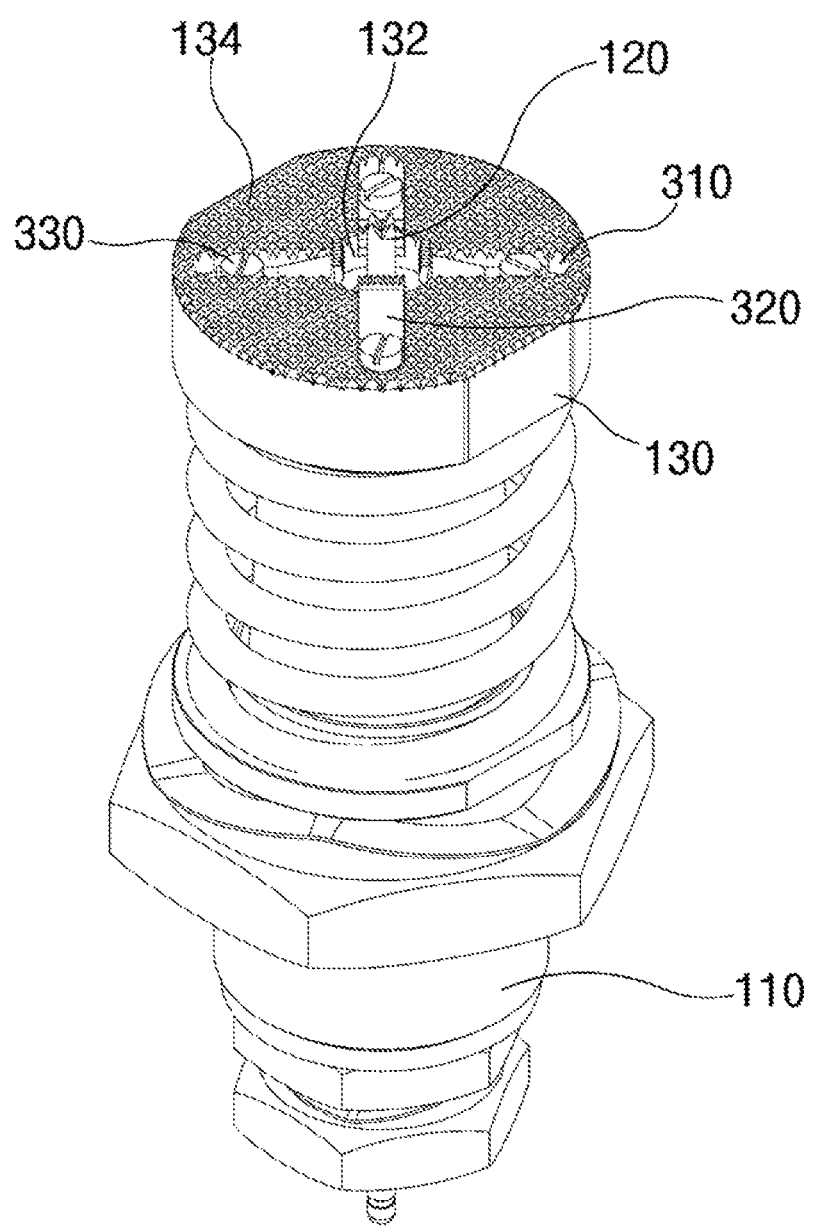
FIG. 8 is a perspective view of a probe according to a second embodiment.

Referring to FIG. 8, at least one installation recess 310 is formed around the central through hole 132 of the head 130. The installation recess 310 extends in a radial direction.

Figure 11:
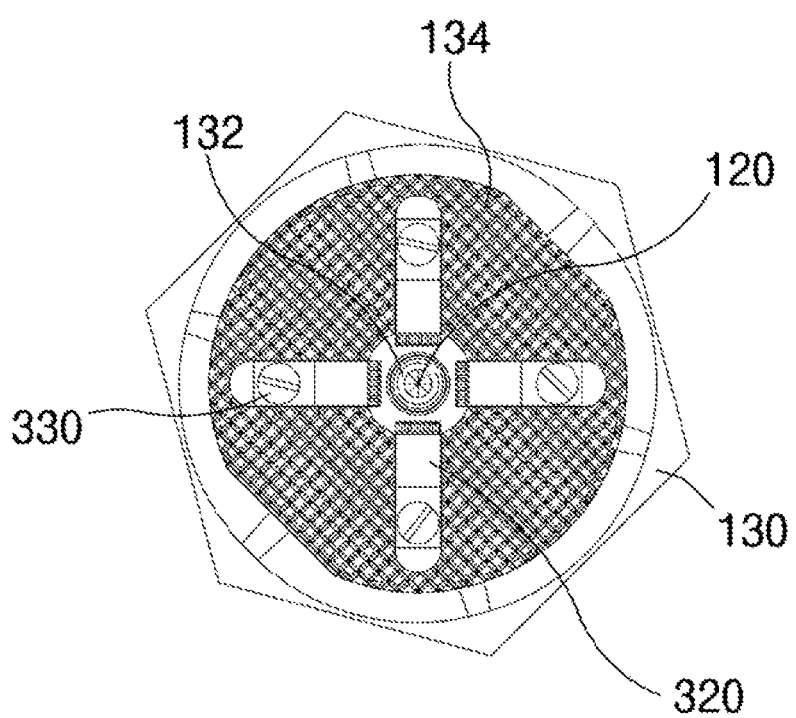
FIG. 11 is a plan view of the head of the probe according to the second embodiment.

According to the second embodiment, as illustrated in FIG. 11, the installation recesses 310 may extend respectively upward, downward, leftward, and rightward from the central through hole 132 formed in the head 130, thereby forming an overall cross shape. Each installation recess 310 may be a rectangular trench with an open upper end. A pin accommodation recess is formed in an outer periphery portion of the installation recess 310 with respect to the central through hole 132.

Figure 9:
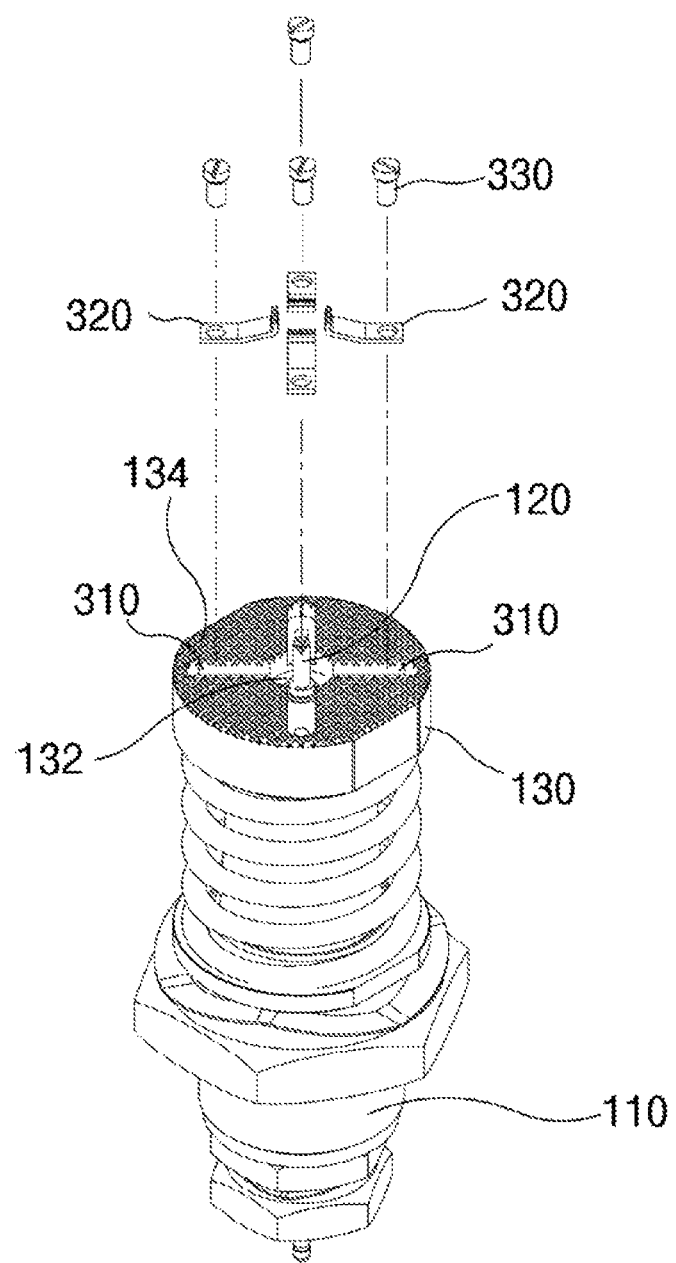
FIG. 9 is a partially exploded perspective view of the probe according to the second embodiment, in which a leaf spring is separated from the probe.

Referring to FIG. 9, a leaf spring 320 provided with a plurality of probe tips 327 may be installed and fixed in the installation recess 310.

Figure 10:
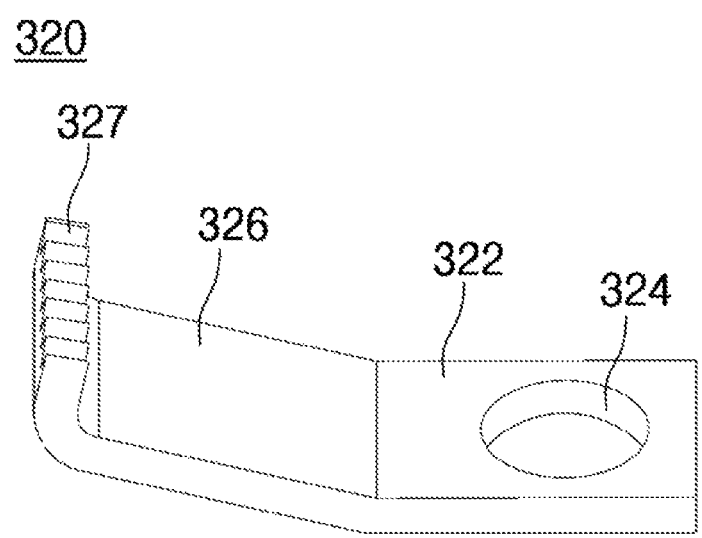
FIG. 10 is a perspective view illustrating the leaf spring provided on a head of the probe according to the second embodiment.

Referring to FIG. 10, the leaf spring 320 may include a fixed plate 322 that is horizontally in surface contact with the bottom surface of the installation recess 310, and the fixed plate 322 may be provided with a pin hole 324. The leaf spring 320 may include a probing plate 326 that extends obliquely upward from an end of the fixed plate 322. An upper end of the probing plate 326 is provided with the probe tips 327.

The leaf spring 320 is installed to be fixed to the bottom surface of the installation recess 310 in such a manner that the probing plate 326 is disposed to be near the central through hole 132. In other words, the leaf spring 320 is installed such that the probe tips 327 are disposed to be near the central through hole 132.

The leaf spring 320 is fixed to the head 130 in such a manner that the leaf spring 320 is first inserted into the installation recess 310 and then a pin 330 is inserted into the pin accommodation recess and the pin hole 324 aligned to overlap each other.

Figure 12:
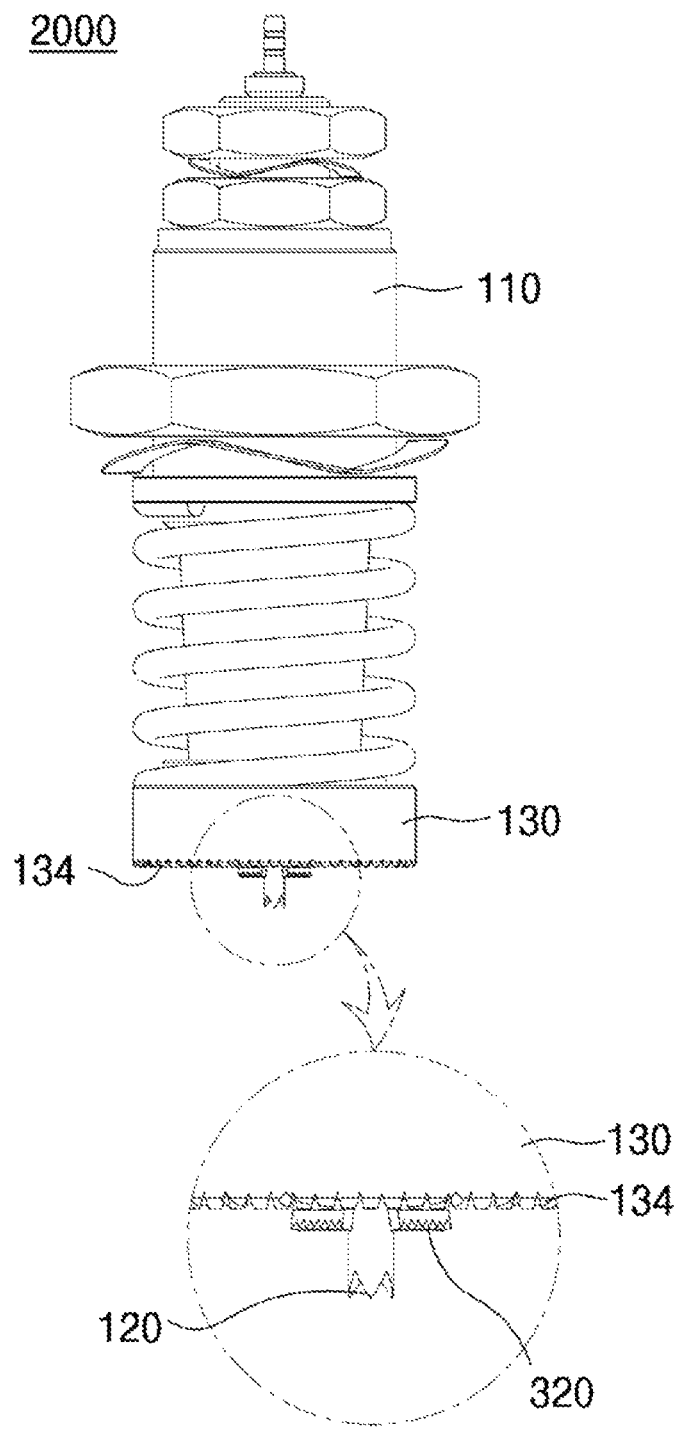
FIG. 12 is a partially expanded view of the head of the probe according to the second embodiment.
Figure 13:
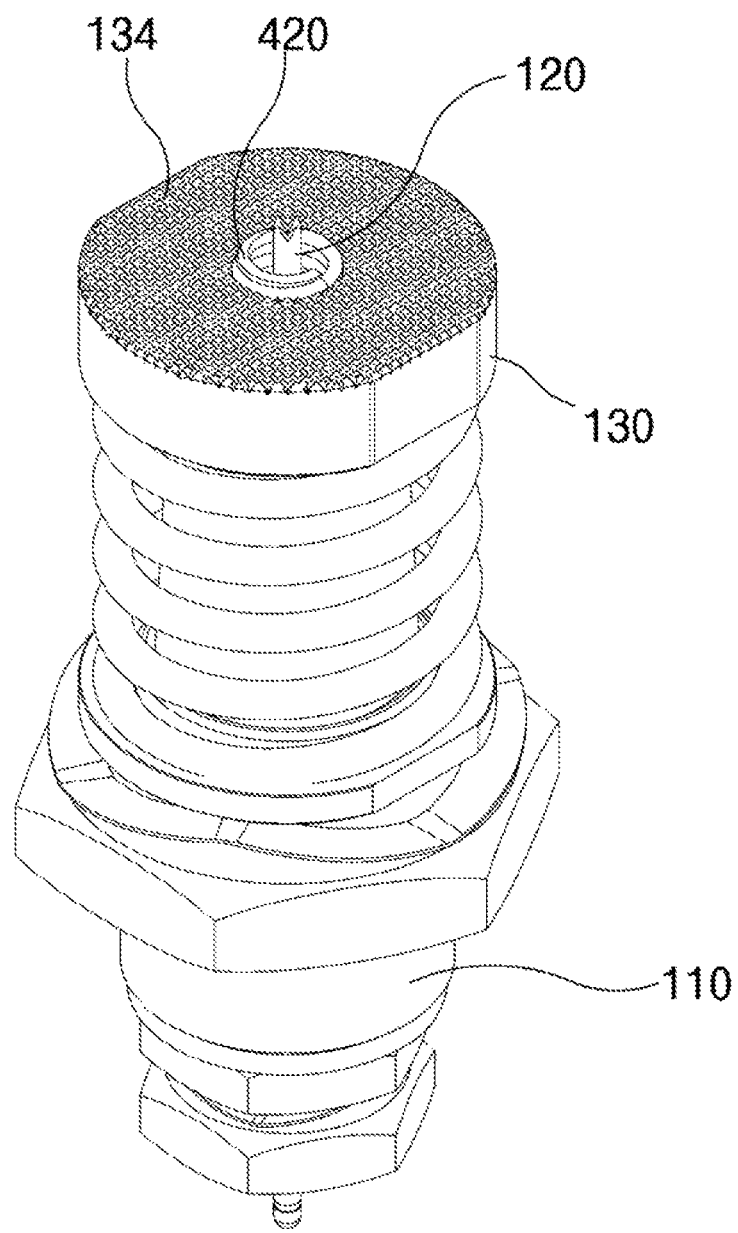
FIG. 13 is a perspective view of a probe according to a third embodiment.

As shown in FIG. 12, the leaf spring 320 is installed in the installation recess 310, and the probe tips 327 of the probing plate 326 protrude farther from the upper end of the head than the probe tips 134 of the head 130 by a predetermined height.

The leaf spring 320 is electrically conductive and has a contact point that comes into contact with the electrode terminal 10. The leaf spring 320 can make precise contact with the electrode terminal 10 and increase a contact area of the test probe with respect to the electrode terminal 10. For this reason, a large amount of current can be applied to the electrode terminal 10. The leaf spring 320 can compensate for an error that is likely to occur when the probe tips 134 of the head 130 come into contact with the electrode terminal 10.

Figure 6:
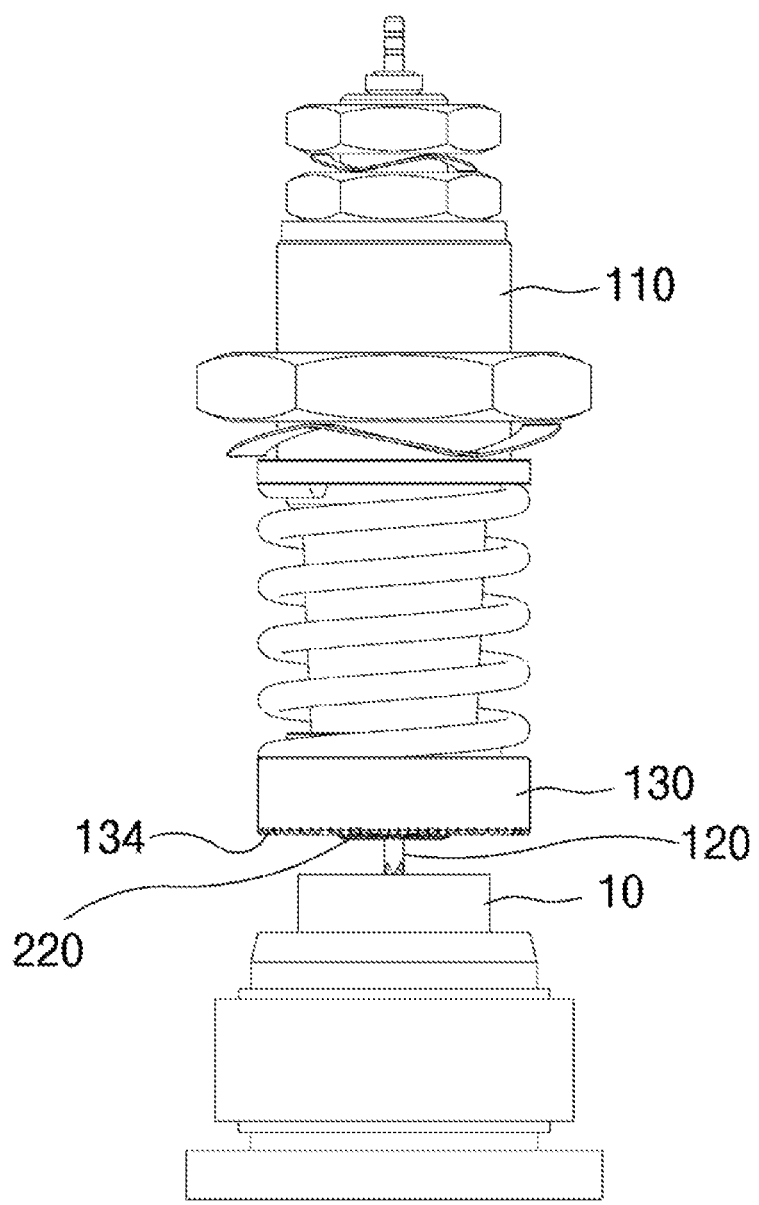
FIGS. 6 and 7 are views illustrating operation states of the probe according to the first embodiment.
Figure 7:
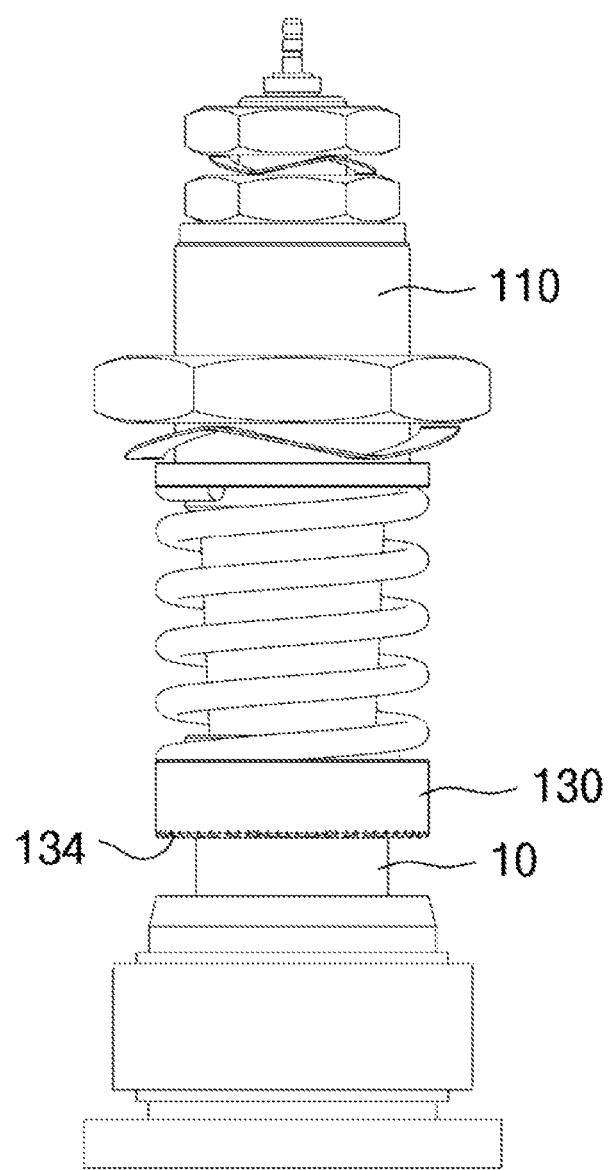

The charge and discharge test probe 2000 according to the second embodiment of the invention operates in a way similar to the way of FIGS. 6 and 7. First, the inner plunger 120 vertically protruding from the upper end of the head 130 first comes into contact with the electrode terminal 10. Next, the leaf springs 320 are compressed against the periphery surface of the inner plunger 120 and come into contact with the electrode terminal 10. Finally, the probe tips 134 of the head 130 come into contact with the electrode terminal 10.

The leaf springs 320 are elastically deformed by pressing force when coming into contact with the electrode terminal 10, and are recovered when separated from the electrode terminal 10 because the pressing force is released.

As described above, at the time of testing a secondary battery, the inner plunger 120 first comes into contact with the electrode terminal 10, the leaf springs 320 then come into contact with the electrode terminal 10, and probe tips 134 finally come into contact with the electrode terminal 10. Thus, sensing is performed.

FIGS. 13 to 16 are views illustrating a charge and discharge test probe 3000 for a secondary battery, according to a third embodiment of the invention. Next, with reference to FIGS. 13 to 16, the charge and discharge test probe 3000 according to the third embodiment will be described below.

Unless otherwise defined, the charge and discharge test probe 3000 according to the third embodiment of the invention includes the features of the charge and discharge test probes 1000 and 2000 according to the first and second embodiments.

Referring to FIGS. 13 to 16, a head 130 is fixed to an upper end of an outer plunger, and is provided with a plurality of probe tips 134 on the upper surface thereof such that the probe tips 134 serve as contact points to come into contact with an electrode terminal 10. An accommodation recess 410 having a predetermined depth is formed in an upper end portion of the head 130. The accommodation recess 410 is formed to communicate with a central through hole 132 that is formed to extend through a center portion of the head 130 and through which an inner plunger 120 passes to protrude from the upper end of the head 130. Specifically, a lower portion of the accommodation recess 410 serves as a fixing space 412. The fixing space 412 has a diameter larger than that of an upper portion of the accommodation recess 410. The bottom of the fixing space 412 is provided with a communication hole 418 through which the inner plunger 120 passes to protrude from the upper end of the head 130. A helical elastic member 420 is installed in the accommodation recess 410 and an upper end of the helical elastic member 420 protrudes farther than the probe tips 134 of the head 130 by a predetermined height.

The helical elastic member 420 is electrically conductive and has a contact point to come into contact with the electrode terminal 10. Since the helical elastic member 420 comes into contact with the electrode terminal 10, a contact area between the test probe and the electrode terminal 10 is increased. Therefore, a large amount of current can be applied to the electrode terminal 10. The helical elastic member 420 can compensate for an error that is likely to occur when the probe tips 134 of the head 130 come into contact with the electrode terminal 10.

Figure 14:
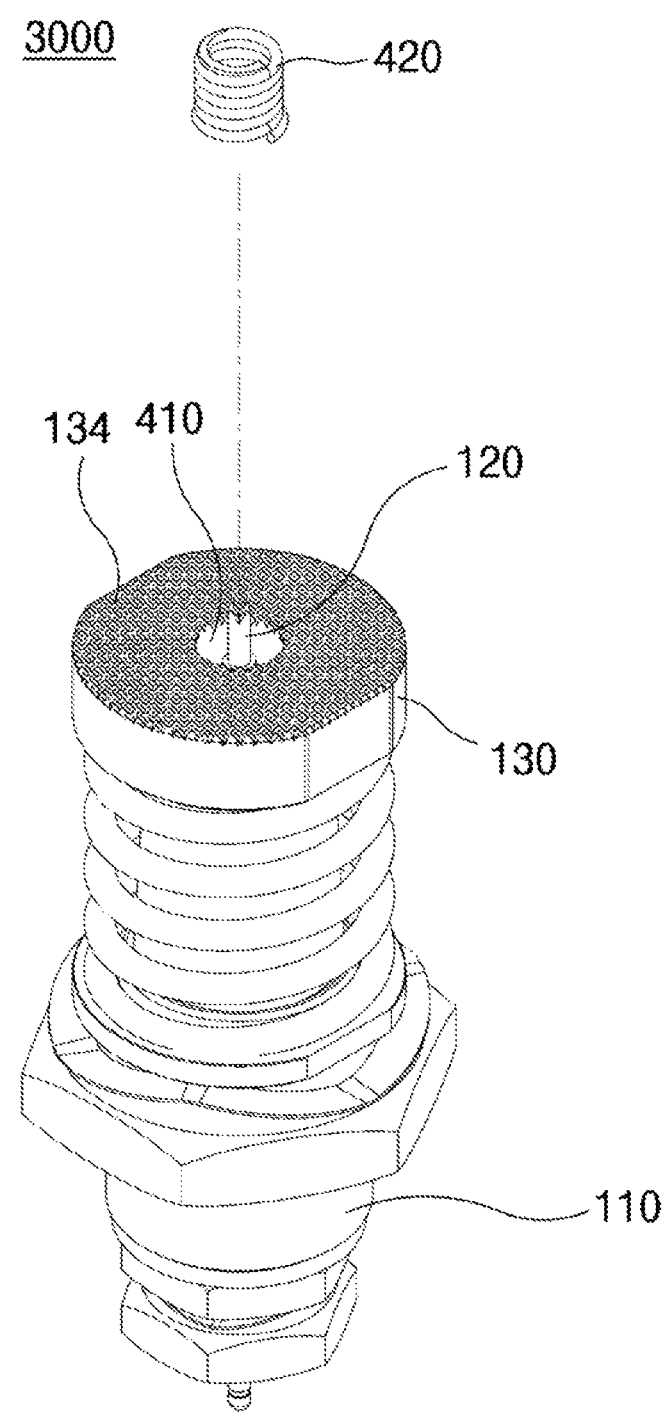
FIG. 14 is a partially exploded perspective view of the probe according to the third embodiment, in which a helical elastic member is separated from the probe.
Figure 15:
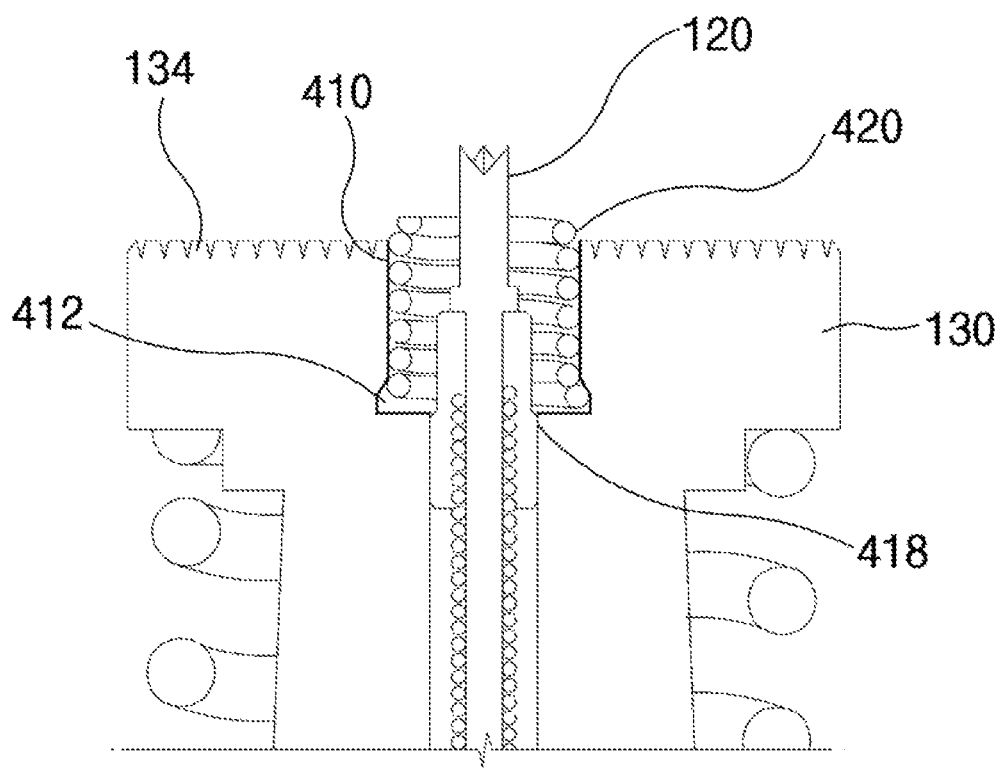
FIG. 15 is a partial cross-sectional view of the probe according to the third embodiment.
Figure 16:
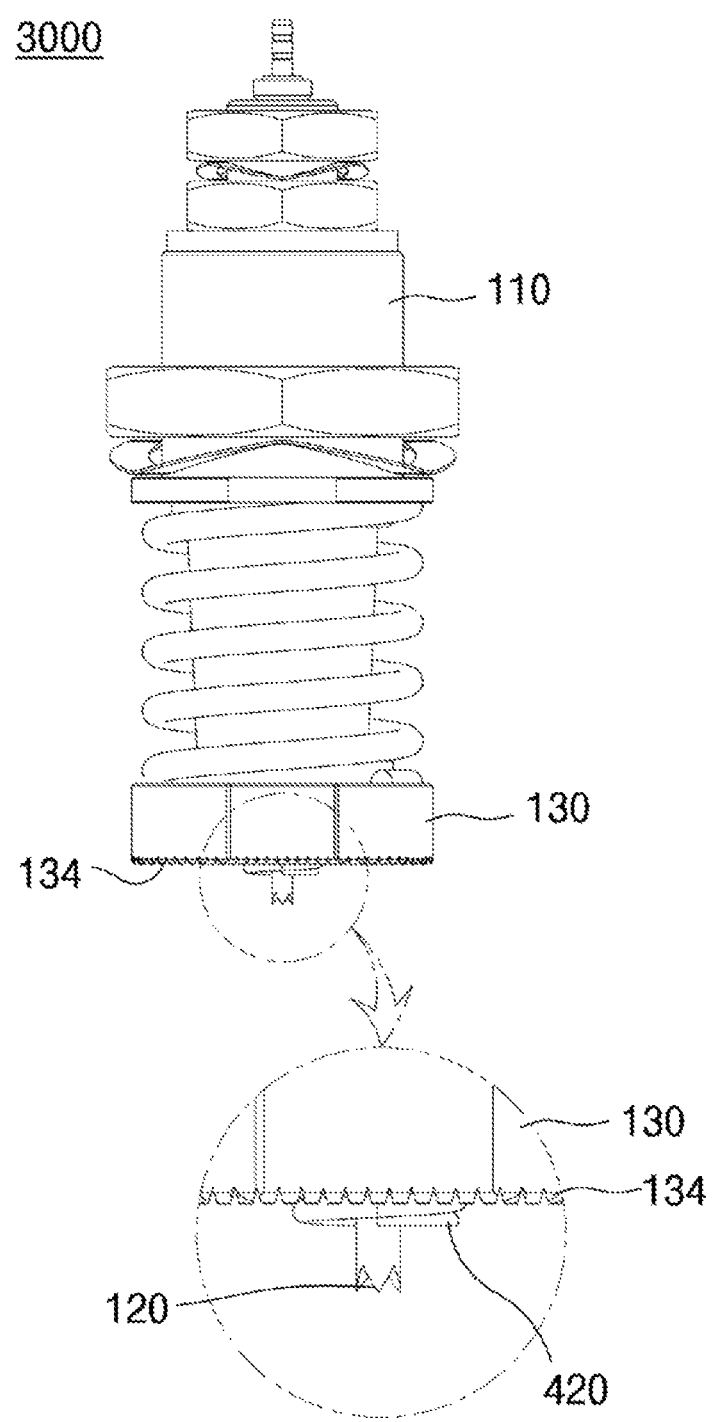
FIG. 16 is a partially expanded view of a head of the probe according to the third embodiment.
Figure 17:
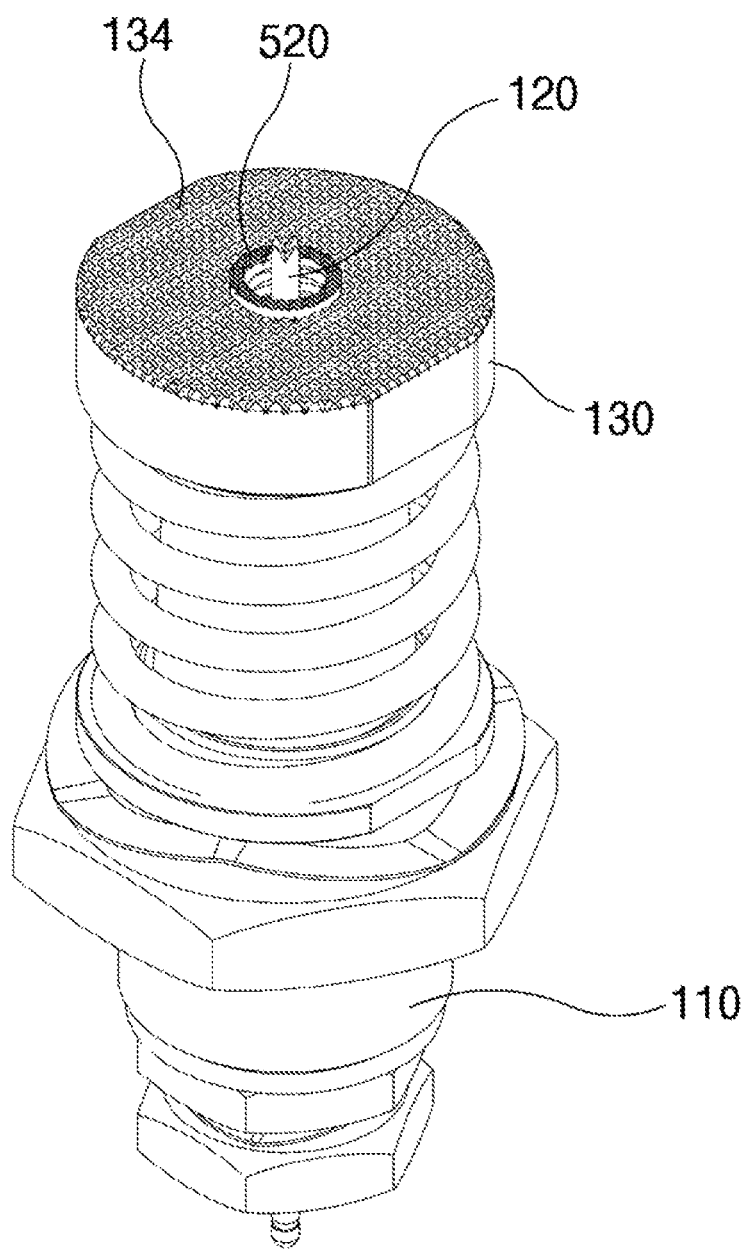
FIG. 17 is a perspective view of a probe according to a fourth embodiment.
Figure 18:
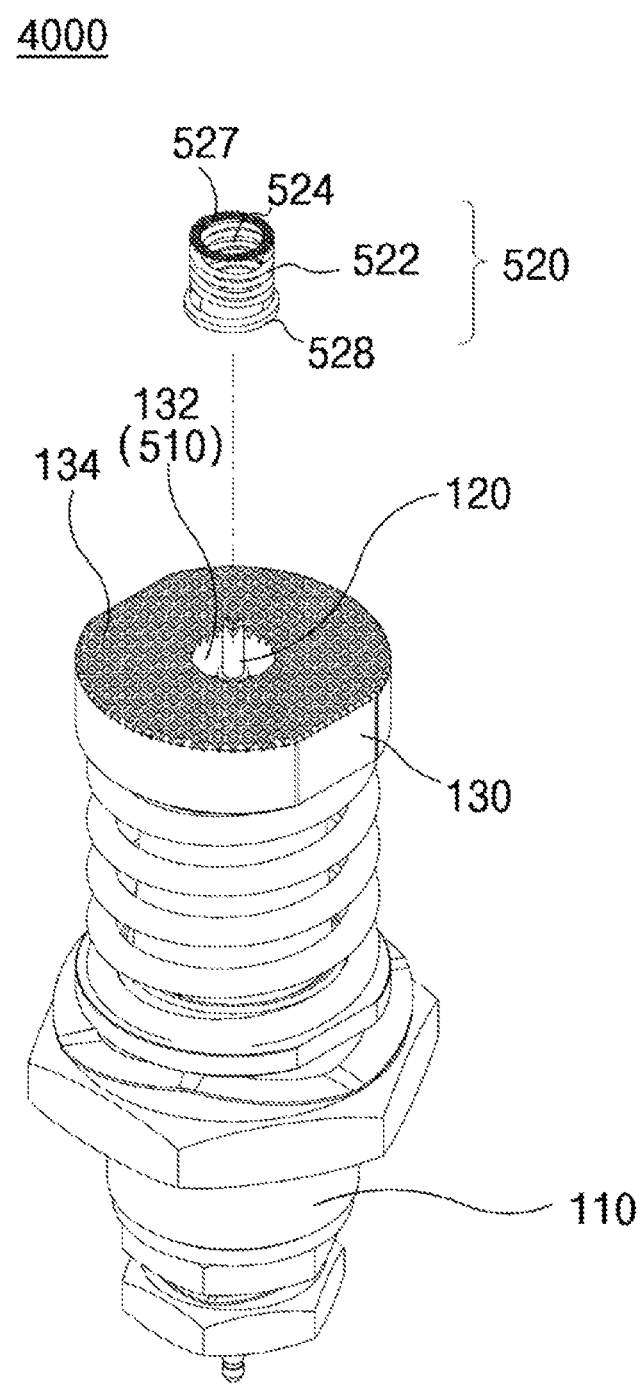
FIG. 18 is a partially exploded perspective view of the probe according to the fourth embodiment, in which a helical elastic member is separated from the probe.
Figure 19:
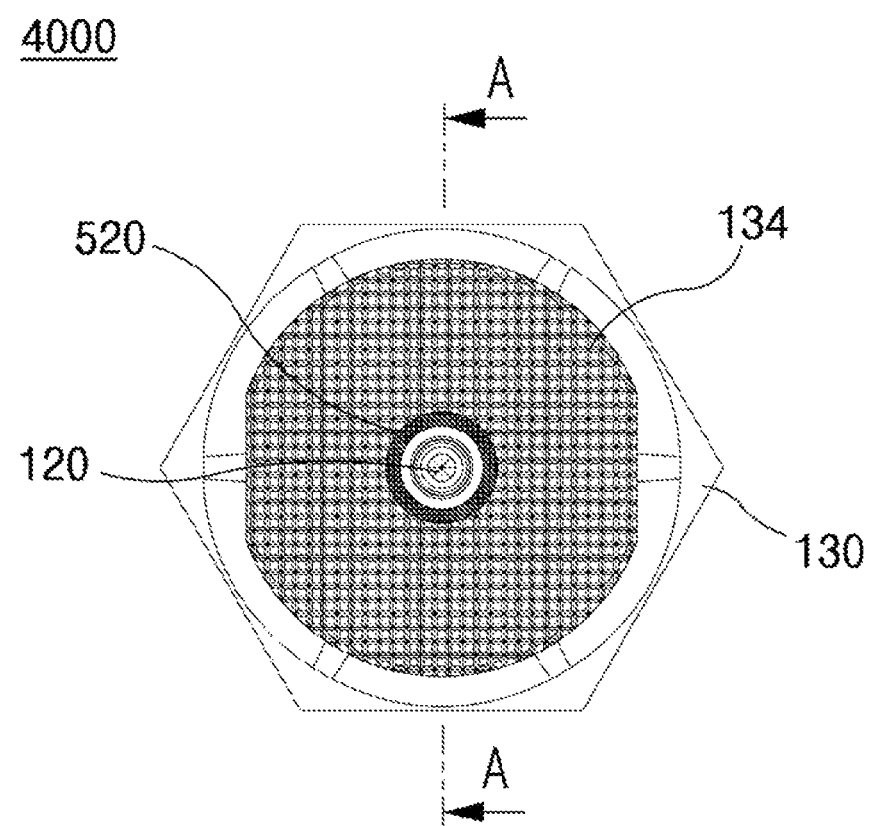
FIG. 19 is a plan view of the probe according to the fourth embodiment.
Figure 20:
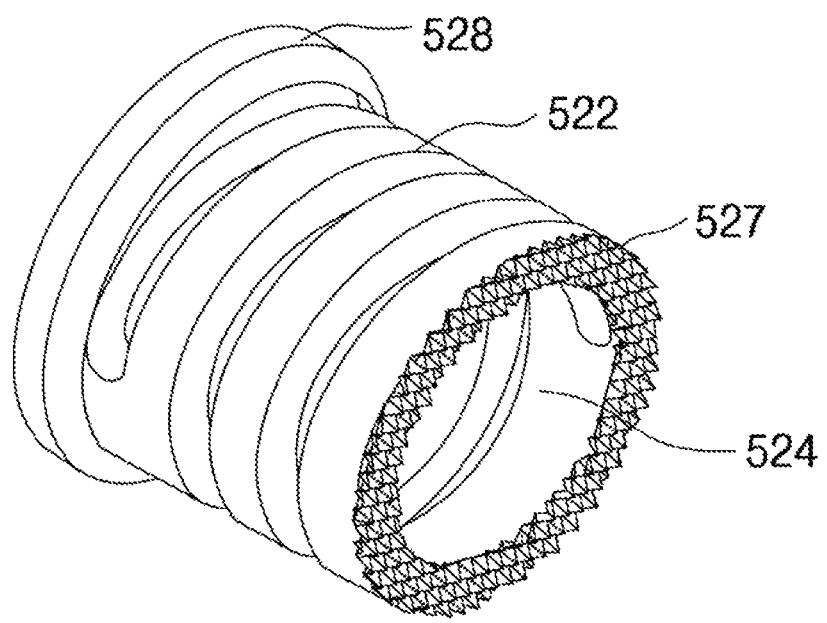
FIG. 20 is a perspective view of a helical elastic member of the probe according to the fourth embodiment.
Figure 21:
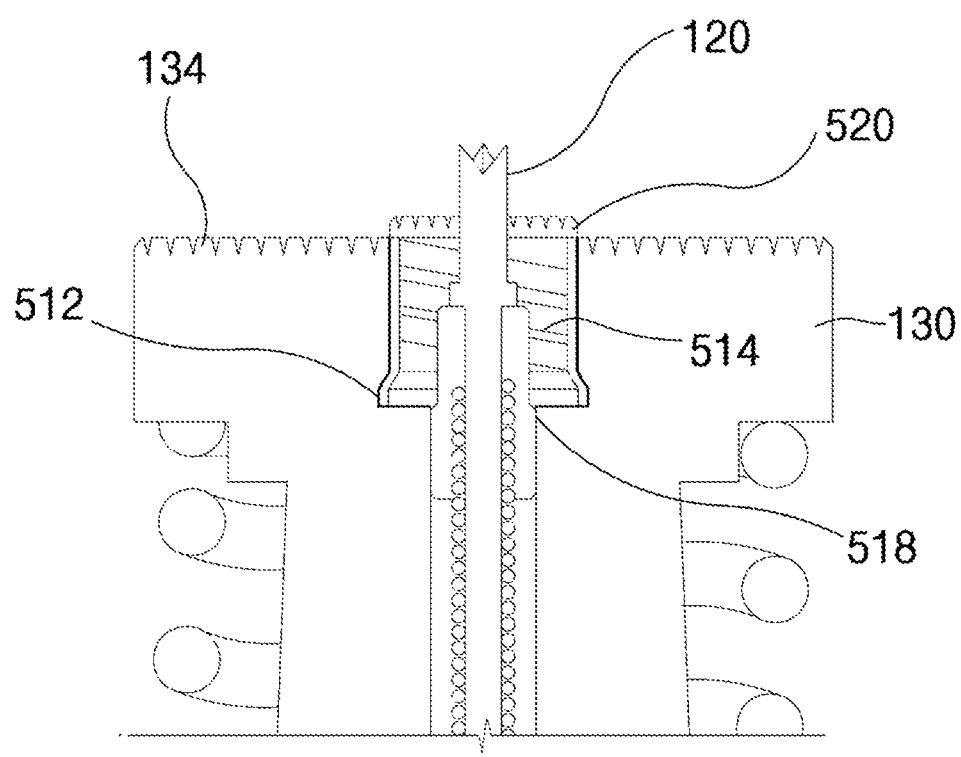
FIG. 21 is a partial cross-sectional view of a head of the probe according to the fourth embodiment.
Figure 22:
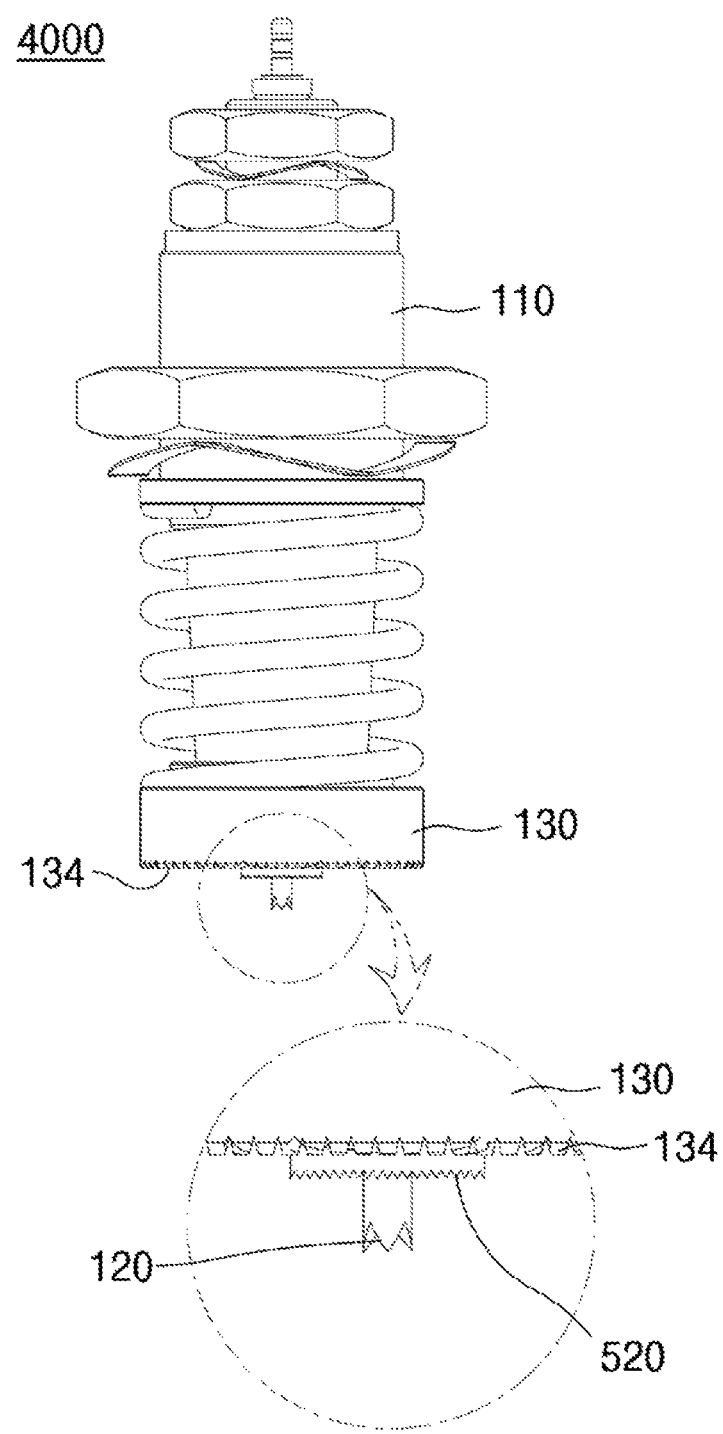
FIG. 22 is a partial expanded view of the head of the probe according to the fourth embodiment.
Figure 23:
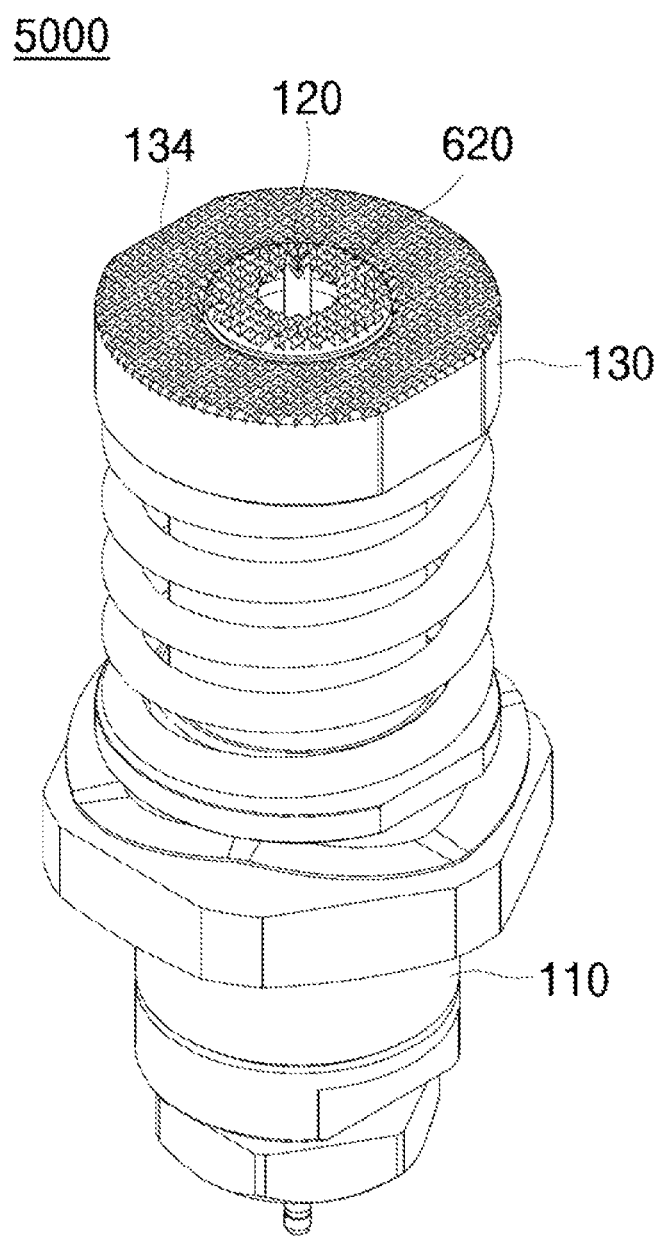
FIG. 23 is a perspective view of a probe according to a fifth embodiment.
Figure 24:
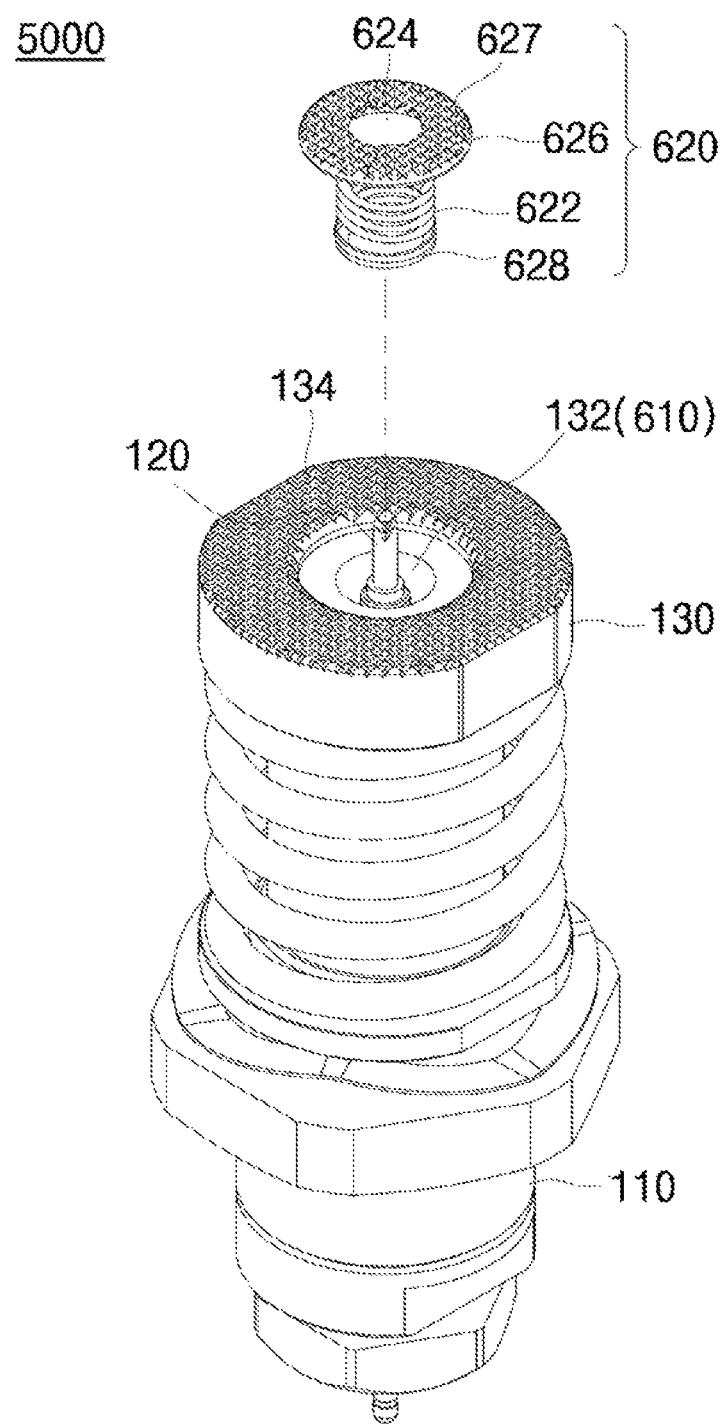
FIG. 24 is a partially exploded perspective view of the probe according to the fifth embodiment, in which a helical elastic member is separated from the probe.
Figure 25:
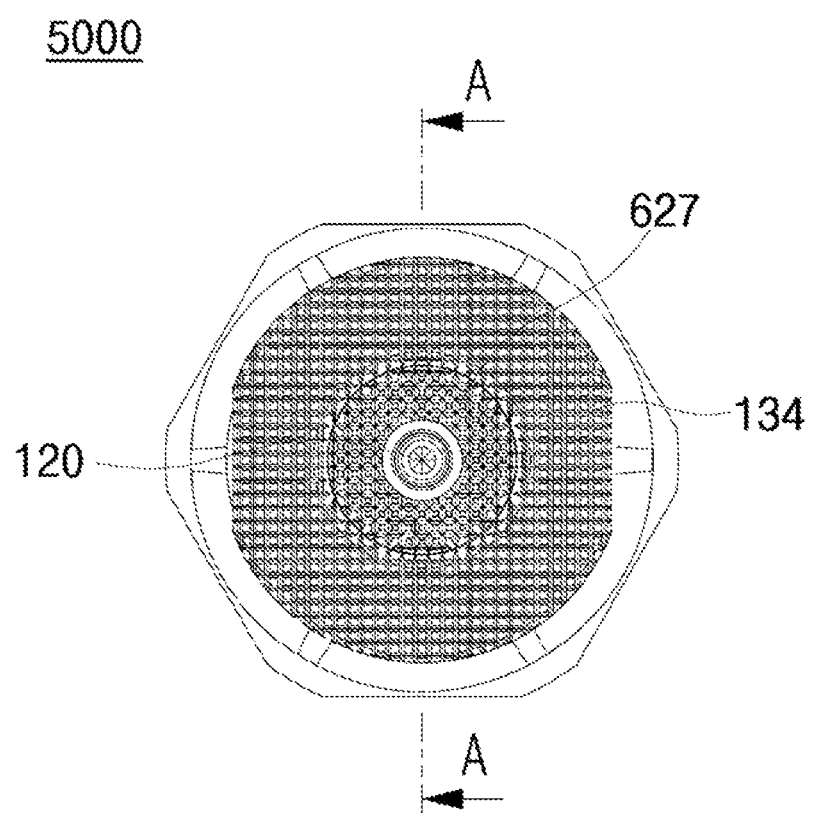
FIG. 25 is a plan view of the probe according to the fifth embodiment.
Figure 26:
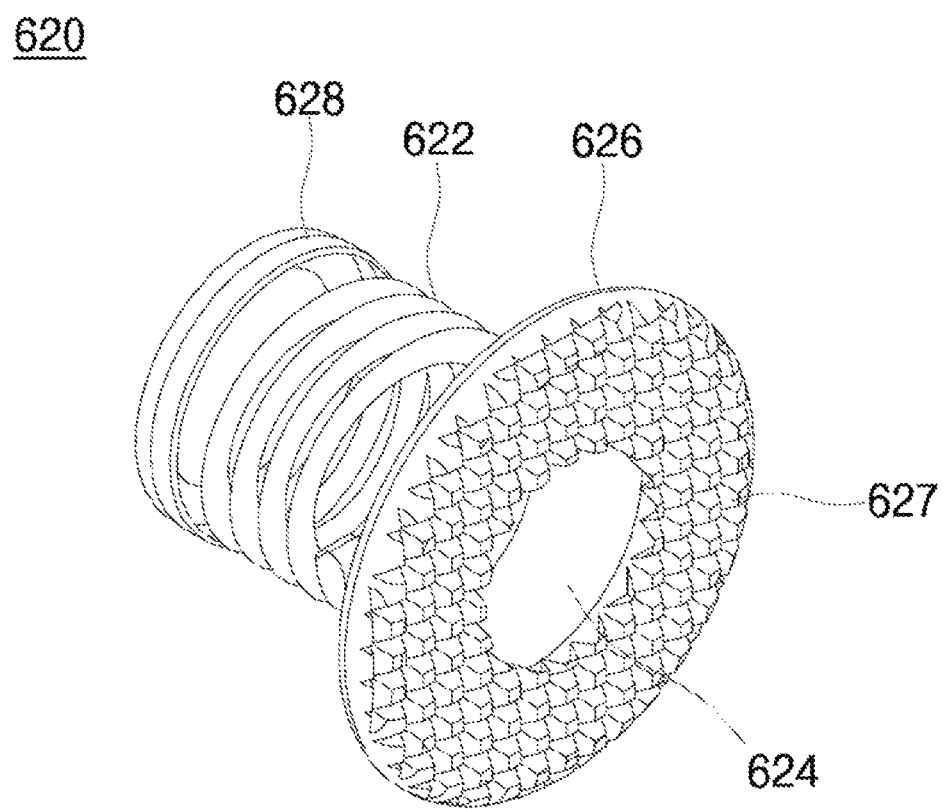
FIG. 26 is a perspective view of the helical elastic member of the probe according to the fifth embodiment.
Figure 27:
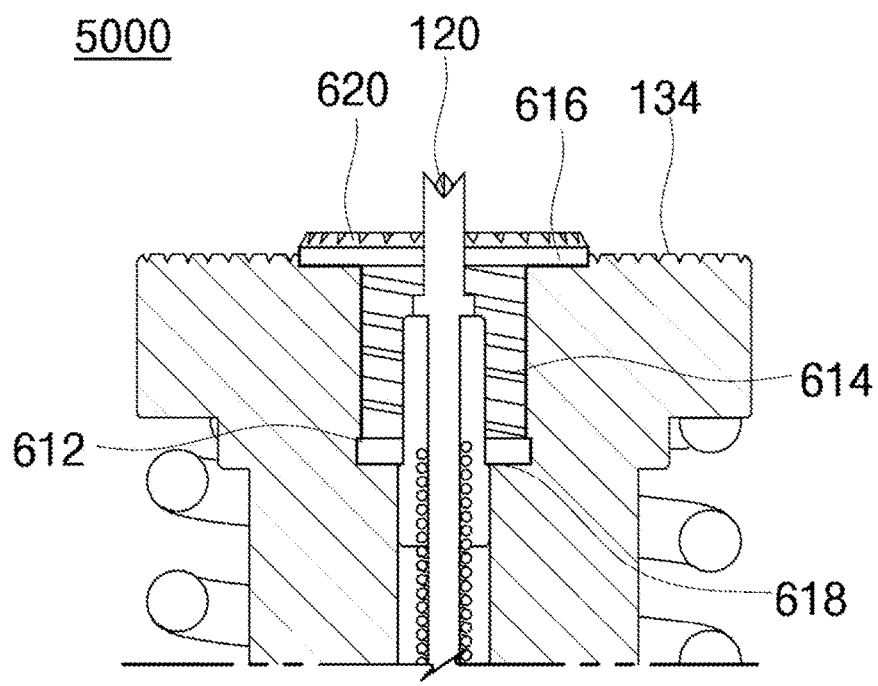
FIG. 27 is a partial cross-sectional view of the head of the probe according to the fifth embodiment.
Figure 28:
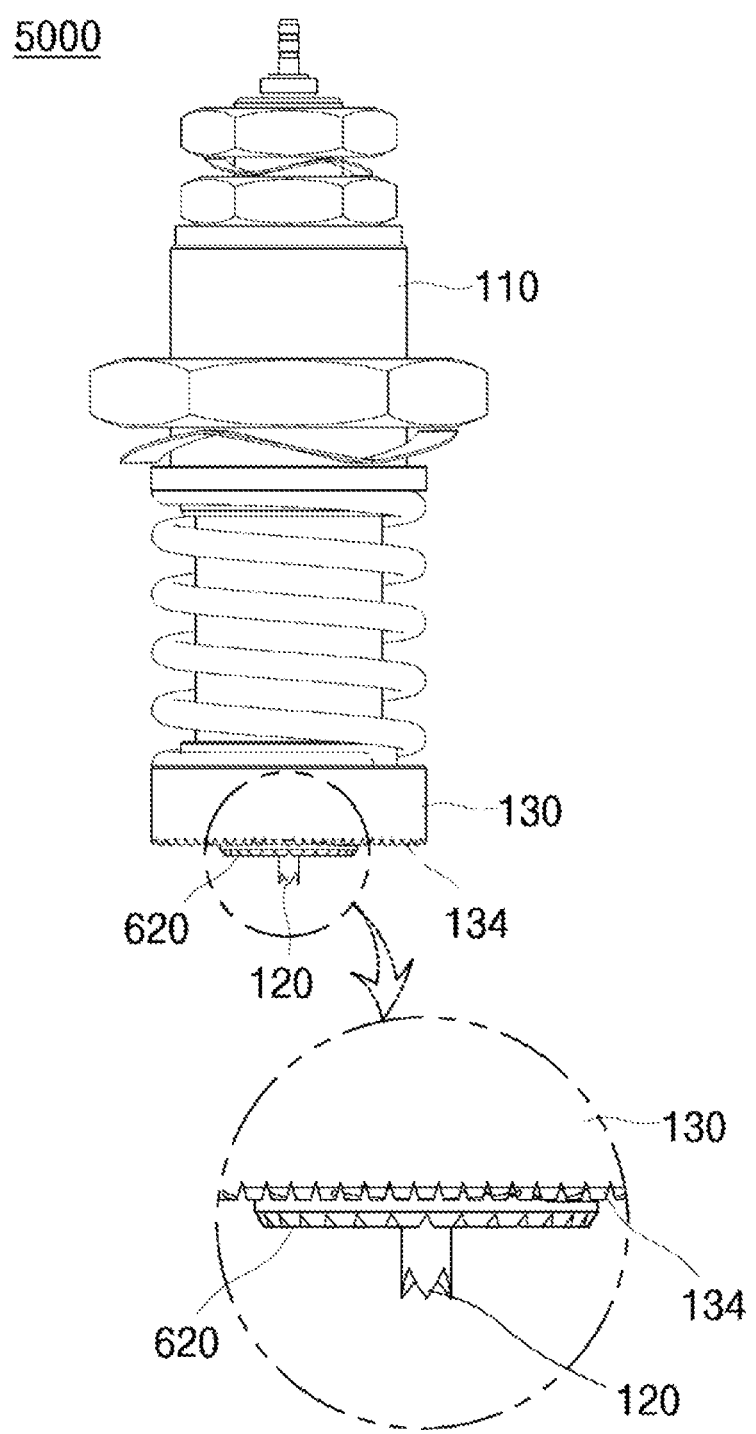
FIG. 28 is a partially expanded view of the head of the probe according to the fifth embodiment.
Figure 29:
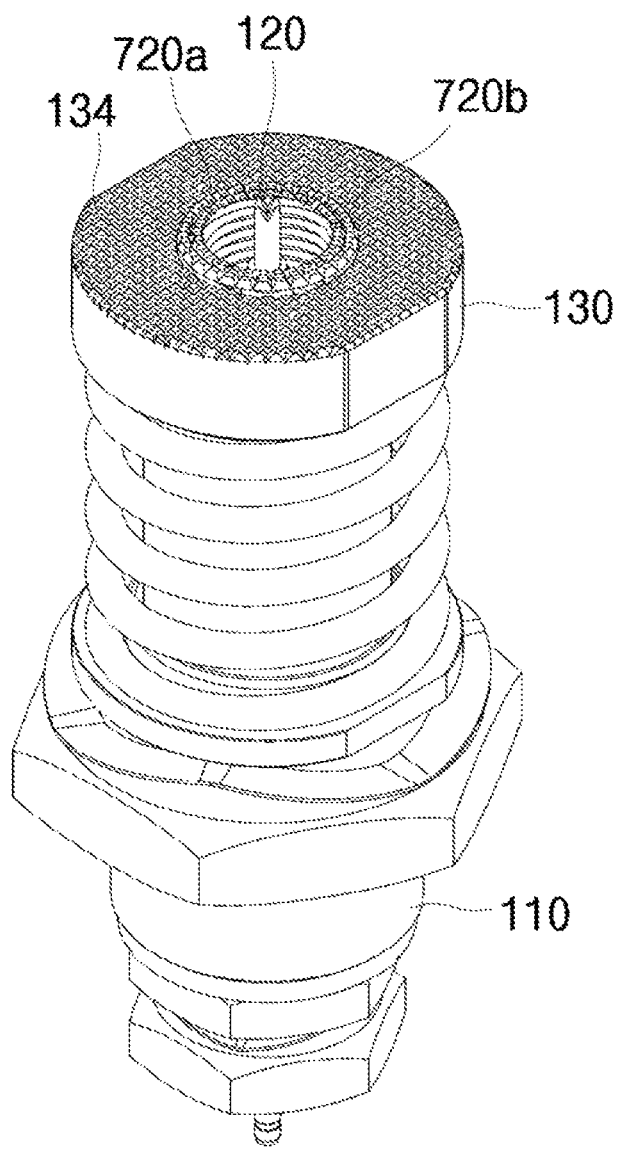
FIG. 29 is a perspective view of a probe according to a sixth embodiment.
Figure 30:
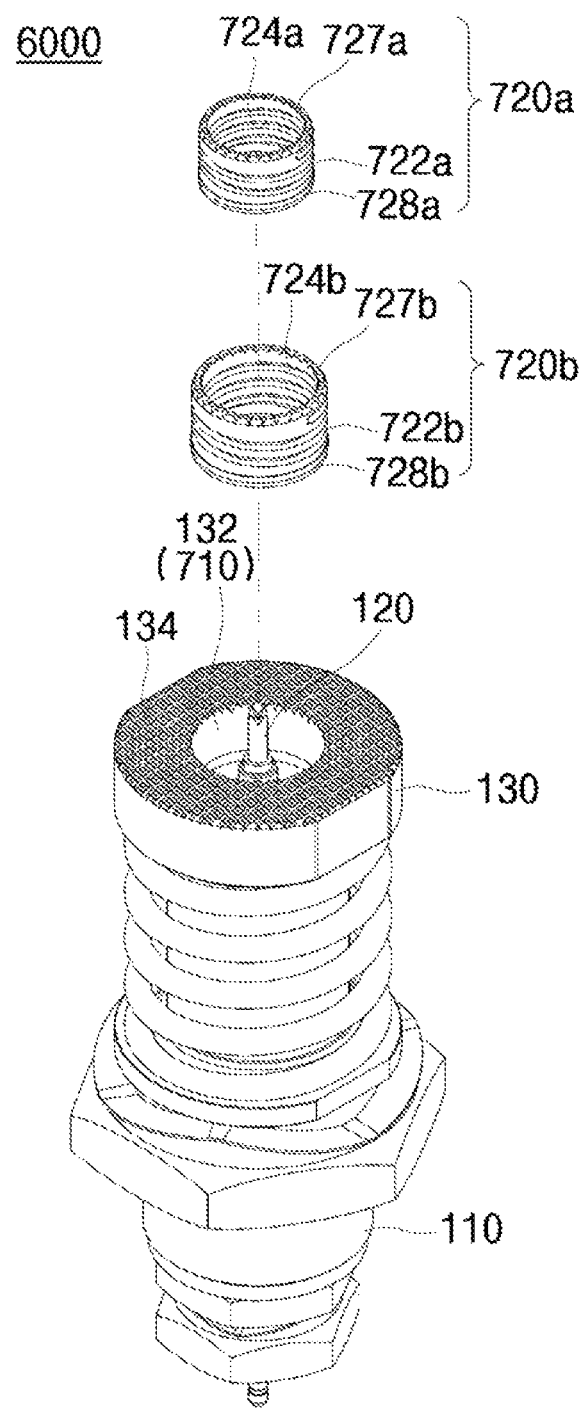
FIG. 30 is a partially exploded view of the probe according to the sixth embodiment, in which two helical elastic members are separated from the probe.
Figure 31:
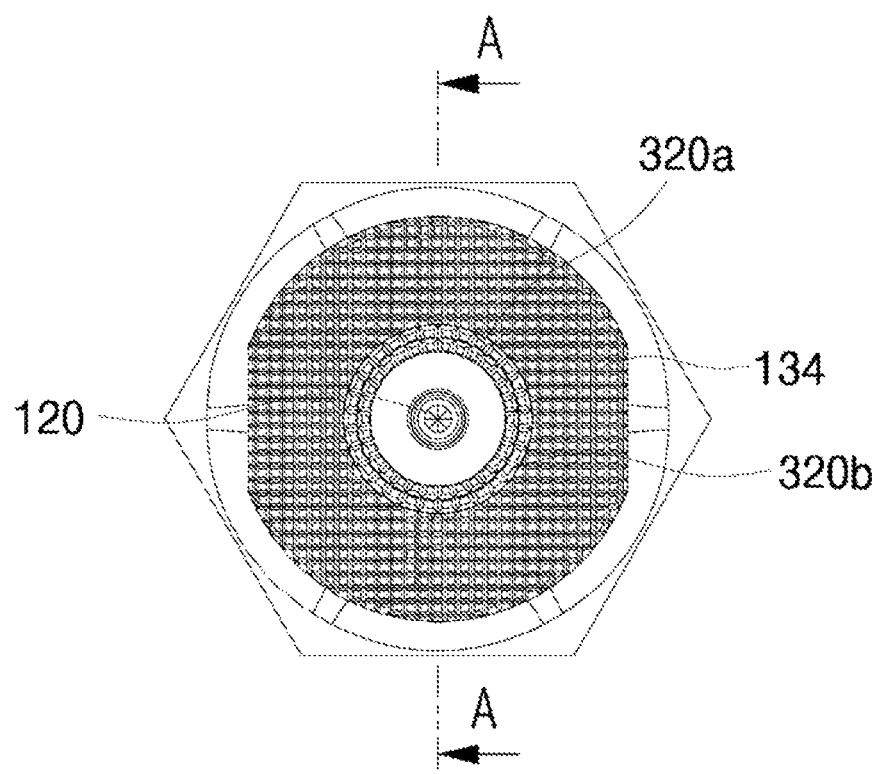
FIG. 31 is a plan view of a head of the probe according to the sixth embodiment.
Figure 32:
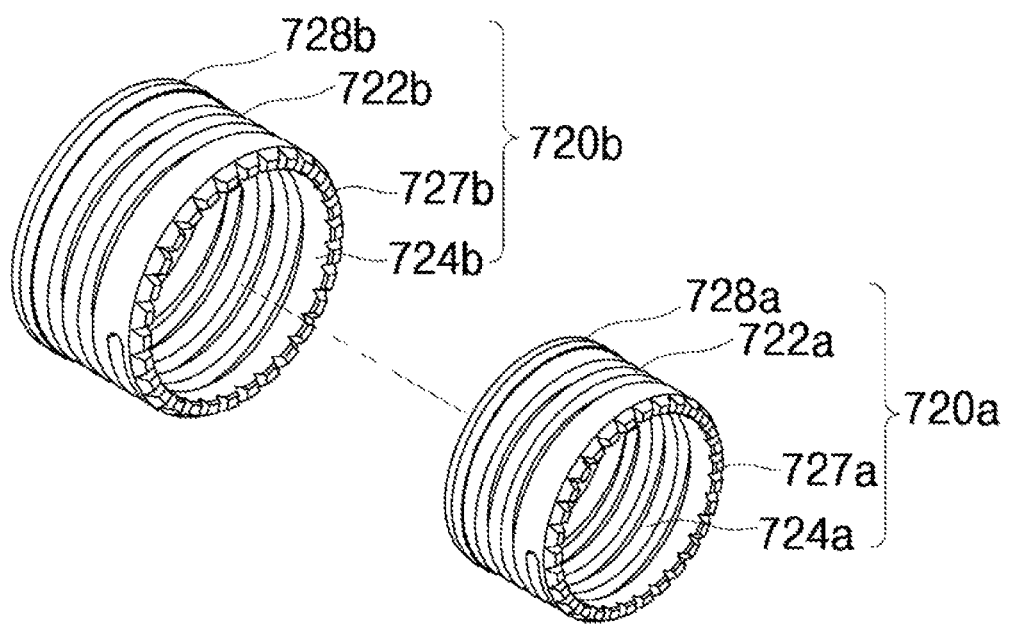
FIG. 32 is a perspective view of the two helical elastic members of the probe according to the sixth embodiment.
Figure 33:
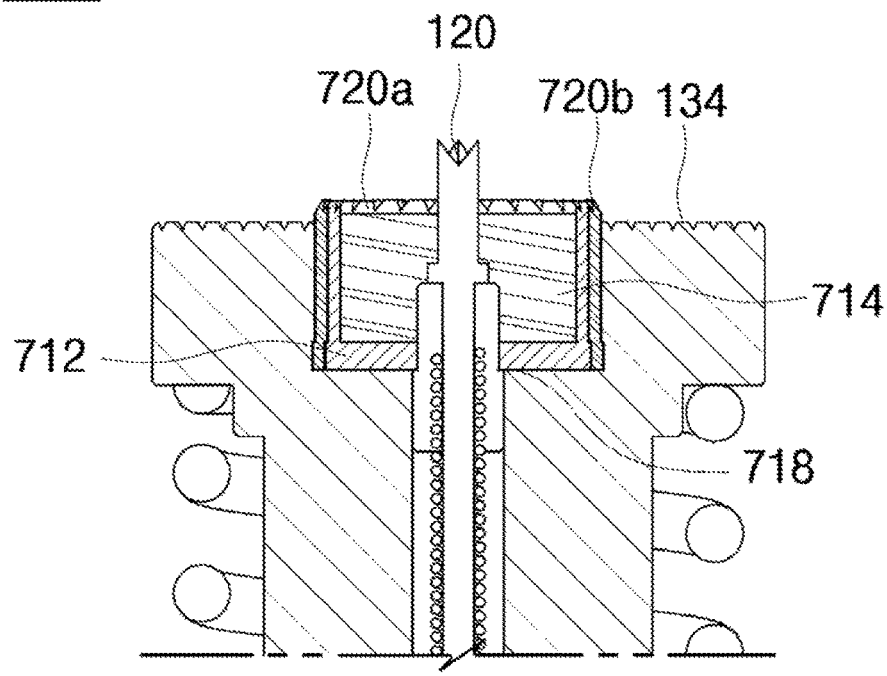
FIG. 33 is a partial cross-sectional view of the head of the probe according to the sixth embodiment.
Figure 34:
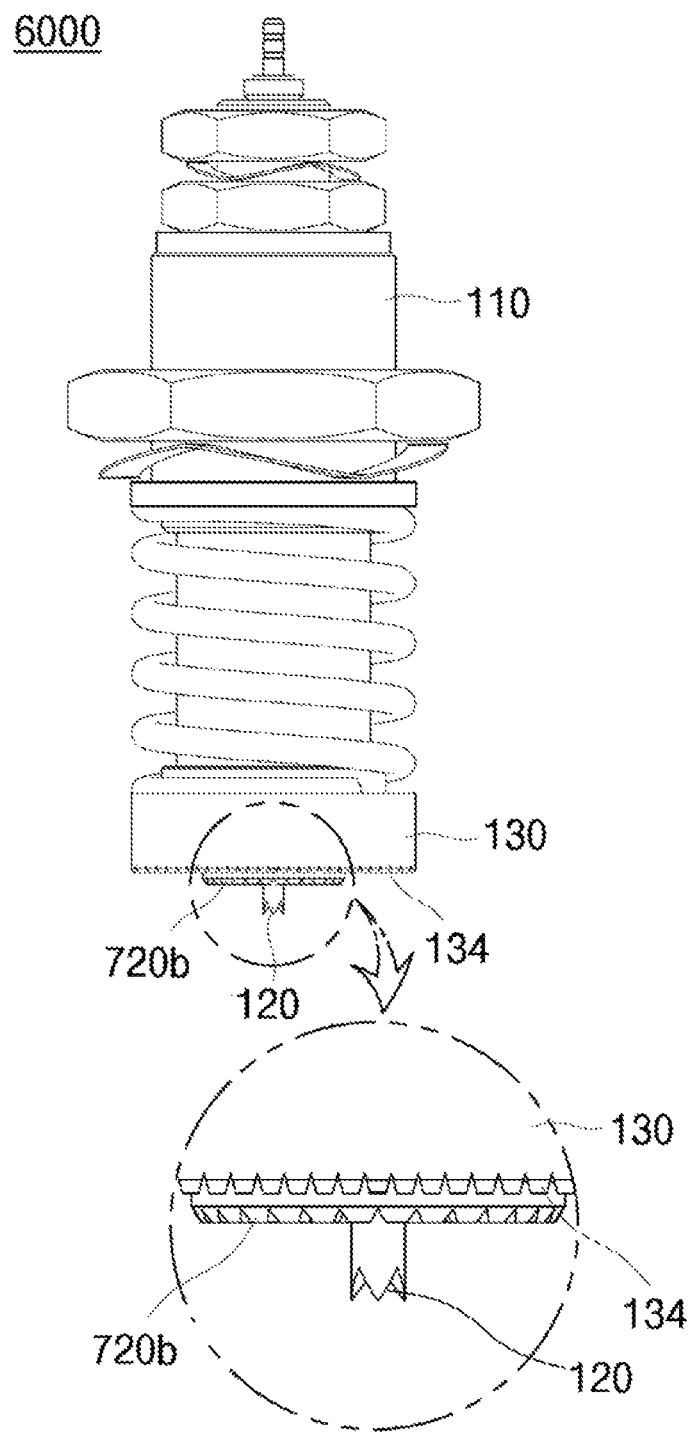
FIG. 34 is a partially expanded view of the head of the probe according to the sixth embodiment.

As shown in FIG. 14, in the charge and discharge test probe 3000 according to the third embodiment of the invention, the helical elastic member 420 may be a general-purpose circular coil spring.

The charge and discharge test probe 3000 according to the third embodiment of the invention operates in a way similar to the way of FIGS. 6 and 7. That is, first, the inner plunger 120 vertically protruding from the upper end of the head 130 comes into contact with the electrode terminal 10. Next, the helical elastic member 420 is compressed against the periphery surface of the inner plunger 120 and comes into contact with the electrode terminal 10. Finally, the probe tips 134 of the head 130 come into contact with the electrode terminal 10.

The helical elastic member 420 is elastically deformed by compressive force when it comes into contact with the electrode terminal 10, and is recovered when it is separated from the electrode terminal 10 because the compressive force is removed.

As described above, the head 130 comes into contact with the electrode terminal 10 such that the inner plunger 120 first comes into contact with the electrode terminal 10, the helical elastic member 420 then comes into contact with the electrode terminal 10, and the probe tips 134 finally come into contact with the electrode terminal 10. Thus, sensing is performed.

FIGS. 17 to 22 are views illustrating a charge and discharge test probe 4000 for a secondary battery, according to a fourth embodiment of the invention. The charge and discharge test probe 4000 according to the fourth embodiment of the invention will be described with reference to FIGS. 17 to 22.

Unless otherwise defined, the charge and discharge test probe 4000 according to the fourth embodiment of the invention includes the features of the charge and discharge test probe 3000 according to the third embodiment.

The charge and discharge test probe 4000 according to the fourth embodiment of the invention includes a helical elastic member 520. The helical elastic member 520 can be obtained by subjecting a pipe to special processing.

With reference to FIGS. 17 to 22, a head 130 is fixed to an upper end of an outer plunger, and the upper surface of the head 130 is provided with a plurality of probe tips 134 to come into contact with an electrode terminal 10. In addition, an accommodation recess 510 having a predetermined depth is formed in an upper portion of the head 130. The accommodation recess 510 is formed to communicate with a central through hole 132 that is formed to extend through a center portion of the head 130 and through which an inner plunger 120 passes to protrude from the upper end of the head 130.

A helical elastic member 520 is installed in the accommodation recess 510.

The helical elastic member 520 is electrically conductive, and has a contact point to come into contact with the electrode terminal 10. Since the helical elastic member 520 as well as the probe tips 134 of the head 130 comes into contact with the electrode terminal 10, a contact area between the test probe and the electrode terminal is increased, and thus a larger amount of current can be applied to the electrode terminal 10. The helical elastic member 520 can compensate for an error that is likely to occur when the probe tips 134 of the head 130 come into contact with the electrode terminal 10.

The helical elastic member 520 has characteristics described below. Namely, the helical elastic member 520 includes a helical body 522 in which each turn of wire has a predetermined thickness, is inclined at a predetermined angle, and is arranged at regular pitches. The body 522 has a helical shape like a coil spring. The body 522 may be formed by winding a flat wire. The body 522 may have a cylindrical hollow 524 in the center thereof. In addition, the helical elastic member 520 has a cylindrical hollow 524 formed in the body 522, a probe tip 527 provided at an upper end of the body 522, and a fixed portion 528 spirally winding and extending from a lower end of the body 522. The fixed portion 528 has a diameter larger than that of the body 522. The fixed portion 528 is fitted into the fixing space 512 of the accommodation recess 510, and thus the helical elastic member 520 is installed and fixed in the center of the head 130.

The helical elastic member 520 protrudes from the probe tips 134 of the head 130 by a predetermined height.

The accommodation recess 510 includes a fixing space 512 and a body accommodation portion 514.

A lower portion of the accommodation recess 510 serves as the fixing space 512 and has a diameter larger than that of the body accommodation portion 514 to accommodate the body 522. In addition, the bottom of the fixing space 512 is provided with a communication hole 518 through which the inner plunger 120 passes to protrude from the upper end of the head 130.

Specifically, the helical elastic member 520 is fitted in the accommodation recess 510, and an upper end of the helical elastic member 520 protrudes from the probe tips 134 of the head 130 by a predetermined height.

The charge and discharge test probe 4000 according to the fourth embodiment of the invention operates in a way similar to the way of FIGS. 6 and 7. First, the inner plunger 120 vertically protruding from the upper end of the head 130 comes into contact with the electrode terminal 10. Next, the helical elastic member 520 is compressed against the periphery surface of the inner plunger 120 and comes into contact with the electrode terminal 10. Finally, the probe tips 134 of the head 130 come into contact with the electrode terminal 10.

The helical elastic member 520 is elastically deformed by compressive force when it comes into contact with the electrode terminal 10, and is recovered when it is separated from the electrode terminal 10 because the compressive force is removed.

As described above, at the time of testing a secondary battery, the head 130 comes into the electrode terminal 10 in a way that the inner plunger 120 first comes into contact with the electrode terminal 10, the helical elastic member 520 then comes into contact with the electrode terminal 10, and the probe tips 134 of the head 130 finally come into contact with the electrode terminal 10. Thus, sensing is performed.

FIGS. 23 to 28 are views illustrating a charge and discharge test probe 5000 for a secondary battery, according to a fifth embodiment of the invention. The charge and discharge test probe 5000 according to the fifth embodiment of the invention will be described with reference to FIGS. 23 to 28.

The charge and discharge test probe 5000 according to the fifth embodiment of the invention includes the features of the charge and discharge test probes 1000, 2000, 3000, and 4000 according to the first to fourth embodiments of the invention.

The charge and discharge test probe 5000 according to the fifth embodiment of the invention has similar construction as the charge and discharge test probe 4000 according to the fourth embodiment of the invention, but is different in a point described below. The diameter of a body accommodation portion 614 to accommodate the body of a helical elastic member 620 is smaller than the diameter of a probe tip assembly accommodation portion 616 to accommodate a probe tip assembly 626 of the helical elastic member 620. Due to a large area of the probe tip assembly 626, a more stable contact between the electrode terminal and the head can be achieved.

The head 130 is fixed to an upper end of an outer plunger. The upper surface of the head 130 is provided with a plurality of probe tips 134 to come into contact with the electrode terminal 10. In addition, an accommodation recess 610 having a predetermined depth is formed in an upper portion of the head 130 so as to communicate with a central through hole 132 extending through a center portion of the head 130. The inner plunger 120 passes through the accommodation recess 610 to protrude from the upper end of the head 130.

A helical elastic member 620 is installed in the accommodation recess 610.

The helical elastic member 620 is electrically conductive and has a contact point to come into contact with the electrode terminal 10. Since the helical elastic member 620 as well as the probe tips 134 of the head 130 come into contact with the electrode terminal 10, a contact area between the test probe and the electrode terminal 10 is increased. Therefore, a larger amount of current per unit can be applied to the electrode terminal 10. The helical elastic member 620 can compensate for an error that is likely to occur when the probe tips 134 of the head 130 come into contact with the electrode terminal 10.

The helical elastic member 620 has characteristics described below. That is, the helical elastic member 620 includes a helical body 622 in which each turn of wire has a predetermined thickness, is inclined at a predetermined angle, and is arranged at regular pitches. The body 622 has a helical shape like a coil spring, and it may be made from a flat wire. In addition, in the helical elastic member 620, an upper portion of the body 622 is provided with a probe tip assembly 626 provided with a plurality of probe tips 627. The probe tip assembly 626 is characterized in that it has a disk shape having a predetermined thickness and being provided with a hole 624 in the center thereof. The diameter of the probe tip assembly 626 is larger than the diameter of the body 622. That is, the probe tips 627 can be formed over a large area. The hole 624 is a cylindrical hollow extending through the body 622 and the probe tip assembly 626.

The helical elastic member 620 may include a fixed portion 628 spirally winding and extending from a lower end of the body 622, in which the diameter of the fixed portion 628 is larger than the diameter of the body 622. Since the fixed portion 628 is fitted in the fixing space 612 of the accommodation recess 610, the helical elastic member 620 can be fixed in the center of the head 130.

The helical elastic member 620 protrudes farther than the probe tips 134 of the head 130 by a predetermined height.

The accommodation recess 610 includes a fixing space 612, a body accommodation recess 614, and a protruding protrusion assembly accommodation portion 616.

The diameter of the body accommodation recess 614 to accommodate the body 622 of the helical elastic member 610 is smaller than the diameter of the probe tip assembly accommodation portion 616 to accommodate the probe tip assembly 626 of the helical elastic member 620. In addition, it is preferable that the fixing space 612 having a diameter larger than that of the body accommodation portion 614 is provided at a lower end portion of the accommodation recess 610, and the bottom of the fixing space 612 is provided with a communication hole 618 through which the inner plunger 120 passes to protrude from the upper end of the head.

Specifically, the helical elastic member 620 is fitted in the accommodation recess 610, and an upper end of the helical elastic member 620 protrudes farther than the probe tips 134 of the head 130 by a predetermined height.

The charge and discharge test probe 5000 according to the fifth embodiment of the invention operates in a way similar to the way of FIGS. 6 and 7. First, the inner plunger 120 vertically protruding from the upper end of the head 130 comes into contact with the electrode terminal 10. Next, the helical elastic member 620 is compressed against the periphery surface of the inner plunger 120 and comes into contact with the electrode terminal 10. Finally, the probe tips 134 of the head 130 come into contact with the electrode terminal 10.

The helical elastic member 620 is elastically deformed by compressive force when it comes into contact with the electrode terminal 10, and is recovered when it is separated from the electrode terminal 10 because the compressive force is removed.

As described above, at the time of testing a secondary battery, the head 130 comes into contact with the electrode terminal 10 in such a manner that the inner plunger 120 first comes into contact with the electrode terminal 10, the helical elastic member 620 then comes into contact with the electrode terminal 10, and the probe tips 134 finally come into contact with the electrode terminal 10. Thus, sensing can be performed.

FIGS. 29 to 34 are views illustrating a charge and discharge test probe 6000 for a secondary battery, according to a sixth embodiment of the invention. Next, the charge and discharge test probe 6000 according to the sixth embodiment of the invention will be described.

Unless otherwise described, the charge and discharge test probe 6000 according to the sixth embodiment of the invention includes all of the features of the charge and discharge test probes 1000, 2000, 3000, 4000, and 5000 according to the first to fifth embodiments of the invention.

The charge and discharge test probe 6000 according to the sixth embodiment of the invention has similar construction as the charge and discharge test probe 4000 according to the fourth embodiment of the invention, but is different in that the test probe 6000 includes a plurality of helical elastic members 720a and 720b. The helical elastic member 720a and 720b are obtained by subjecting a pipe to special processing in a processing machine. Since the test probe 6000 includes the multiple helical elastic members 720a and 720b, the test probe 600 can make a stable contact with the electrode terminal 10.

A head 130 is fixed to an upper end of an outer plunger. The upper surface of the head is provided with a plurality of probe tips 134 to come into contact with the electrode terminal 10. That is, the head 130 has a contact point on the upper surface thereof. In addition, the head 130 has a central through hole 132 through which the inner plunger 120 passes to protrude from an upper end of the head 130. In an upper portion of the central through hole 132, an accommodation recess 710 having a predetermined depth may be provided such that the inner plunger 120 can pass through the accommodation recess 710 to protrude from the upper end of the head 130.

In the accommodation recess 710, the multiple helical elastic members 720a and 720b are installed. In FIGS. 29 to 34, only two helical elastic members 720a and 720b are illustrated.

Each of the multiple helical elastic members 720a and 720b is electrically conductive, and has a contact point to come into contact with the electrode terminal 10. Since the multiple helical elastic members 720a and 720b come into contact with the electrode terminal 10, the test probe has a large contact area with respect to the electrode terminal 10. In addition, since the probe tips 134 of the head 130 also come into contact with the electrode terminal, the contact area is further increased, and thus a large amount of current can be applied to the electrode terminal. The multiple helical elastic member 720a and 720b can compensate for an error that is likely to occur when the probe tips 134 of the head 130 come into contact with the electrode terminal 10.

Each of the multiple helical elastic members 720a and 720b has characteristics described below. The helical elastic members 720a and 720b include respective bodies 722a and 722b in which each turn of wire has a predetermined thickness, is inclined at an equal angle, and is arranged at regular pitches. The bodies 722a and 722b have a helical shape like a coil spring. The helical bodies 722 and 722b may be made from flat wire. In addition, the helical elastic members 720a and 720b have respective cylindrical hollows 724a and 724b formed in the respective bodies 722a and 722b, probe tips 727a and 727b formed on upper ends of the bodies 722a and 722b, and respective circular fixed portions 728a and 728b. The fixed portions 728a and 728b spirally wind and extend from lower ends of the bodies 722a and 722b. The fixed portions 728a and 728b have a diameter larger than that of the bodies 722a and 722b. In this case, the fixed portions 728a and 728b are fitted in a fixing space of an accommodation recess 710, so that the helical elastic members 720a and 720b can be and fixed in the center of the head 130.

Preferably, the helical elastic members 720a and 720b protrude farther than the probe tips 134 of the head 130 by a predetermined height. In addition, one helical elastic member 720a may be provided within the other helical elastic member 720b, and this combined assembly may be received in the accommodation recess 710.

The accommodation recess 710 includes a fixing space 712 and a body accommodation portion 714.

A lower portion of the accommodation recess 710 serves as the fixing space 712 having a diameter larger than that of the body accommodation portion 714 to accommodate the bodies 722a and 722b. Preferably, the bottom of the fixing space 712 may be provided with a communication hole 718 through which the inner plunger 120 passes to protrude from the upper end of the head.

Specifically, the multiple helical elastic members 720a and 720b are installed in the accommodation recess 710 and protrude farther than the probe tips 134 of the head 130.

The charge and discharge test probe 6000 according to the sixth embodiment of the invention operates in a way similar to the way of FIGS. 6 and 7. First, the inner plunger 120 vertically protruding from the upper end of the head 130 comes into contact with the electrode terminal 10. Next, the helical elastic members 720a and 720b are compressed against the periphery surface of the inner plunger 120 and come into contact with the electrode terminal 10. Finally, the probe tips 134 of the head 130 come into contact with the electrode terminal 10.

The helical elastic members 720a and 720b are elastically deformed by compressive force when they come into contact with the electrode terminal 10 and are recovered when they are separated from the electrode terminal 10 because the compressive force is removed.

As described above, at the time of testing a secondary battery, the head 130 comes into contact with the electrode terminal 10 such that the inner plunger 120 first comes into contact with the electrode terminal 10, the helical elastic members 720a and 720b then come into contact with the electrode terminal 10, and the probe tips 134 of the head 130 finally come into contact with the electrode terminal 10. Thus, sensing is performed.

In summary, the charge and discharge test probes 3000, 4000, 5000, and 6000 according to the third to sixth embodiments have common features described below.

That is, each of the charge and discharge test probe 3000, 4000, 5000, and 6000 according to the third to sixth embodiments includes: the cylindrical outer plunger with a through hole; the inner plunger 120 coaxially arranged in the outer plunger, electrically insulated from the outer plunger, and elastically moved up and down through the outer plunger to protrude and retreat by elastic force of a spring; the head 130 fixed to the upper end of the outer plunger, provided with the central through hole 132 through which the inner plunger 120 passes to protrude from the upper end of the head, and provided with the probe tips 134 on the upper surface thereof; and the helical elastic member 420, 520, 620, or 720a and 720b mounted to the head 130. The helical elastic members 420, 520, 620, 720a, and 720b protrude farther than the probe tips 134 of the head 130 by a predetermined height. The helical elastic members 420, 520, 620, 720a, and 720b have contact points to come into contact with an electrode terminal 10 of a secondary battery. The helical elastic members are elastically deformed by compressive force when coming into contact with the electrode terminal 10 and recovered when separated from the electrode terminal 10 because the compressive force is removed.

The charge and discharge test probes 1000, 2000, 3000, 4000, 5000, and 6000 according to the first to sixth embodiments have the construction described below in common.

That is, each of the charge and discharge test probes 1000, 2000, 3000, 4000, 5000, and 6000 according to the first to sixth embodiments includes: the cylindrical outer plunger having a through hole; the inner plunger 120 coaxially arranged in the outer plunger, electrically insulated from the outer plunger, and moved up and down through the outer plunger by elastic force of a spring; the head 130 fixed to the upper end of the outer plunger, provided with the central through hole 132 that is a through hole extending through the head in a longitudinal direction such that the inner plunger 120 passes through the central through hole 132 to protrude from the head 130, and provided with the probe tips 134 formed on the upper surface thereof; and the conductive elastic member 220, 320, 420, 520, 620, or 720a and 720b. Each of the elastic members 220, 320, 420, 520, 620, or 720a and 720b protrude farther than the probe tips 134 of the head 130 by a predetermined height. The elastic members 220, 320, 420, 520, 620, 720a, and 720b have a contact point to come into contact with the electrode terminal 10 of a secondary battery. The elastic members 220, 320, 420, 520, 620, 720a, and 720b are elastically deformed by compressive force when coming into contact with the electrode terminal 10 and are recovered when separated from the electrode terminal 10 because the compressive force is removed.

As described above, according to the charge and discharge test probes 1000, 2000, 3000, 4000, 5000, and 6000 according to the first to sixth embodiments, the head 130 to come into contact with the electrode terminal 10 of a secondary battery is provided with an additional contact means. Thus, each of the probes has multiple contact points to come into contact with the electrode terminal 10. Therefore, it is possible to compensate for an error that is likely to occur when the probe tips 134 of the head 130 come into contact with the electrode terminal 10, thereby ensuring a reliable electrical current to the electrode terminal 10.

What is claimed is:

1. A charge and discharge test probe for a secondary battery, the probe comprising:
an inner plunger moved up and down by elastic force;
a head provided with a plurality of probe tips formed on an upper end thereof and a central through hole through which the inner plunger passes to protrude from the upper end of the head; and
a first conductive elastic member mounted to the head,
wherein the plurality of probe tips have contact points to comes into contact with an electrode terminal of the secondary battery, and
wherein the first conductive elastic member is elastically deformed by compressive force when the first conductive elastic member comes into contact with the electrode terminal of the secondary battery and is recovered when the compressive force is removed.

2. The charge and discharge test probe according to claim 1, wherein the first conductive elastic member protrudes farther than the plurality of probe tips formed on the upper end of the head.

3. The charge and discharge test probe according to claim 1, wherein the head is provided with a recess and the first conductive elastic member is installed in the recess.

4. The charge and discharge test probe according to claim 3, wherein the recess is open at an upper end and has a trapezoidal cross section that is relatively narrow at the open upper end and relatively broad at a closed lower end.

5. The charge and discharge test probe according to claim 3, wherein the first conductive elastic member is a canted coil spring.

6. The charge and discharge test probe according to claim 3, wherein the first conductive elastic member is a leaf spring with a probe tip,
the recess comprises one or more recesses arranged in radial directions with respect to the central through hole formed in the head, and
a pin accommodation recess is formed in a portion of the recess such that a pin to fix the leaf spring is inserted into the pin accommodation recess.

7. The charge and discharge test probe according to claim 6, wherein the recesses are arranged respectively at an upper side, lower side, left side, and right side of the central through hole.

8. The charge and discharge test probe according to claim 6, wherein the leaf spring comprises:
a fixed plate that is horizontally in surface contact with a bottom surface of the recess;
a pin hole formed in a portion of the fixed plate; and
a probing plate extending obliquely upward from an end of the fixed plate and having an upper end provided with the probe tip.

9. The charge and discharge test probe according to claim 8, wherein the leaf spring is installed in the recess such that the probing plate is disposed to be near the central through hole.

10. The charge and discharge test probe according to claim 3, wherein the first conductive elastic member has a helical shape.

11. The charge and discharge test probe according to claim 10, wherein the recess is formed such that a lower portion thereof serves as a fixing space having a diameter larger than that of an upper portion of the recess, and
a bottom of the fixing space is provided with a communication hole through which the inner plunger passes to protrude from the upper end of the head.

12. The charge and discharge test probe according to claim 11, wherein the first conductive elastic member comprises:

a helical body in which each turn of wire has a predetermined thickness;

a cylindrical hollow formed in a center portion of the body;

a probe tip provided at an upper end of the body; and a fixed portion extending from a lower end of the body and having a diameter larger than that of the body.

13. The charge and discharge test probe according to claim 10, wherein the fixed portion is fitted in the fixing space of the recess.

14. The charge and discharge test probe according to claim 10, wherein the first conductive elastic member is a coil spring.

15. The charge and discharge test probe according to claim 10, wherein the first conductive elastic member comprises:

a helical body in which each turn of wire has a predetermined thickness; and a probe tip assembly provided with a probe tip and installed at an upper end of the body.

16. The charge and discharge test probe according to claim 15, wherein the recess is formed such that a portion of the recess to accommodate the body has a diameter smaller than that of a portion of the recess to accommodate the probe tip assembly.

17. The charge and discharge test probe according to claim 1, further comprising a second conductive member mounted to the head.

18. The charge and discharge test probe according to claim 17, wherein the first conductive elastic member and the second conductive elastic member have a helical shape, and each of the first conductive elastic member and the second conductive elastic member comprises:

a helical body in which each turn of wire has a predetermined thickness, is inclined at a predetermined angle, and is arranged at regular pitches;

a cylindrical hollow formed in a center portion of the body;

a probe tip formed at an upper end of the body; and a fixed portion disposed at a lower end of the body and having a diameter larger than that of the body.

19. The charge and discharge test probe according to claim 18, wherein the head is provided with a recess, the first conductive elastic member and the second conductive elastic member are installed in the recess, a lower portion of the recess serves as a fixing space having a diameter larger than that of an upper portion of the recess, and a bottom of the fixing space is provided with a communication hole through which the inner plunger passes to protrude from the upper end of the head.

* * * * *